United States Patent
Brown

(10) Patent No.: US 9,890,033 B2
(45) Date of Patent: Feb. 13, 2018

(54) SILICON-ON-SAPPHIRE DEVICE WITH MINIMAL THERMAL STRAIN PRELOAD AND ENHANCED STABILITY AT HIGH TEMPERATURE

(71) Applicant: Honeywell International Inc., Morristown, NJ (US)

(72) Inventor: Gregory C. Brown, Chanhassen, MN (US)

(73) Assignee: Honeywell International Inc., Morris Plains, NJ (US)

( * ) Notice: Subject to any disclaimer, the term of this patent is extended or adjusted under 35 U.S.C. 154(b) by 3 days.

(21) Appl. No.: 14/679,420

(22) Filed: Apr. 6, 2015

(65) Prior Publication Data

US 2016/0289061 A1 Oct. 6, 2016

(51) Int. Cl.
*B81B 3/00* (2006.01)
*B81C 1/00* (2006.01)
(Continued)

(52) U.S. Cl.
CPC .......... *B81B 3/0078* (2013.01); *B81B 3/004* (2013.01); *B81C 1/00904* (2013.01);
(Continued)

(58) Field of Classification Search
CPC ...... G01L 9/0055; G03G 9/107; G03G 9/113; G03G 9/1139; G03G 9/1133
See application file for complete search history.

(56) References Cited

U.S. PATENT DOCUMENTS 4,373,399 A * 2/1983 Beloglazov ........... G01L 9/0055
338/22 SD
5,174,926 A * 12/1992 Sahagen ............... G01L 9/0055
252/519.13
(Continued)

FOREIGN PATENT DOCUMENTS

EP 1983566 10/2008
JP 2007271280 10/2007

OTHER PUBLICATIONS

Cerofolini et al., "Fast Track Communication Hydrogen injection and retention in nanocavities of single-crystalline silicon", "Journal of Ohysucs D: Applied Physics", Feb. 25, 2009, pp. 1-4, Publisher: IOP Publishing Ltd., Published in: GB.
(Continued)

*Primary Examiner* — Lex Malsawma
*Assistant Examiner* — Gardner W Swan
(74) *Attorney, Agent, or Firm* — Fogg & Powers LLC

(57) ABSTRACT

A silicon-on-sapphire chip with minimal thermal strain preload is provided. The chip includes a sapphire substrate having a first-sapphire surface and an opposing second-sapphire surface; and a silicon layer overlaying the first-sapphire surface. The silicon layer is formed by: creating a plurality of buried cavities in a plane within tens of microns from a first-silicon surface of a silicon wafer; laser fusing the first-silicon surface to the first-sapphire surface at room temperature to attach the silicon wafer to a sapphire wafer; and cleaving the silicon wafer along the plane including the plurality of buried cavities. A silicon-wafer layer is formed from the silicon material between the first-silicon surface and the plane of the plurality of buried cavities. The silicon-wafer layer and the sapphire wafer form a silicon-on-sapphire wafer. The silicon-on-sapphire chip is formed by dicing the silicon-on-sapphire wafer.

18 Claims, 15 Drawing Sheets

(51) Int. Cl.
*G01L 9/00* (2006.01)
*H01L 21/762* (2006.01)
*H01L 21/86* (2006.01)

(52) U.S. Cl.
CPC ...... *G01L 9/0055* (2013.01); *H01L 21/76254* (2013.01); *H01L 21/86* (2013.01); *B81B 2201/0264* (2013.01); *B81B 2203/0127* (2013.01); *B81B 2207/094* (2013.01); *B81C 2203/037* (2013.01)

(56) References Cited

U.S. PATENT DOCUMENTS

| | | | | |
|---|---|---|---|---|
| 5,181,417 | A * | 1/1993 | Nishida | G01L 9/0042 73/114.18 |
| 6,003,380 | A * | 12/1999 | Sasaki | G01L 9/0055 73/720 |
| 7,152,478 | B2 | 12/2006 | Peterson et al. | |
| 8,141,429 | B2 | 3/2012 | Guo | |
| 2001/0029087 | A1 * | 10/2001 | Kurtz | B81C 1/00357 438/455 |
| 2005/0096562 | A1 * | 5/2005 | Delalic | A61B 5/0031 600/561 |
| 2008/0094167 | A1 * | 4/2008 | Yoshikawa | G01L 19/04 338/2 |
| 2009/0061591 | A1 * | 3/2009 | Akiyama | H01L 21/76254 438/406 |
| 2012/0119336 | A1 * | 5/2012 | Akiyama | H01L 21/76254 257/629 |
| 2012/0280355 | A1 * | 11/2012 | Akiyama | H01L 21/76254 257/507 |
| 2014/0290375 | A1 | 10/2014 | Brida | |
| 2015/0068315 | A1 * | 3/2015 | Davis | G01L 19/0007 73/727 |
| 2015/0200129 | A1 * | 7/2015 | Konishi | H01L 21/76254 257/506 |
| 2016/0273989 | A1 * | 9/2016 | Brida | G01L 19/04 |

OTHER PUBLICATIONS

Griffin et al., "A Sapphire Based Fiber Optic Dynamic Pressure Sensor for Harsh Environments: Fabrication and Characterization", "49th AIAA Aerospace Sciences Meeting including the New Horizons Forum and Aerospace Exposition", Jan. 4-7, 2011, pp. 1-11.
"400 Series Silicon on Sapphire Plastic Melt Pressure Transducer MV Output Models", , pp. 1-4, Publisher: Sensonetics, Inc.
Stuchebnikov, "Silicon-on-Sapphire Structures as a Material for Piezoresistive Mechanical Transducers", "Journal of Communications Technology and Electronics", 2005, pp. 622-637, vol. 50, No. 6.
European Patent Office, "European Search Report for EP Application No. 16163058.7-1504", "from Foreign counterpart of U.S. Appl. No. 14/679,420", dated Oct. 18, 2016, pp. 1-8, Published in: EP.
Stuchebnikov, "SOS Strain Gauge Sensors for Force and Pressure Transducers", Jan. 31, 1991, pp. 207-213.

* cited by examiner

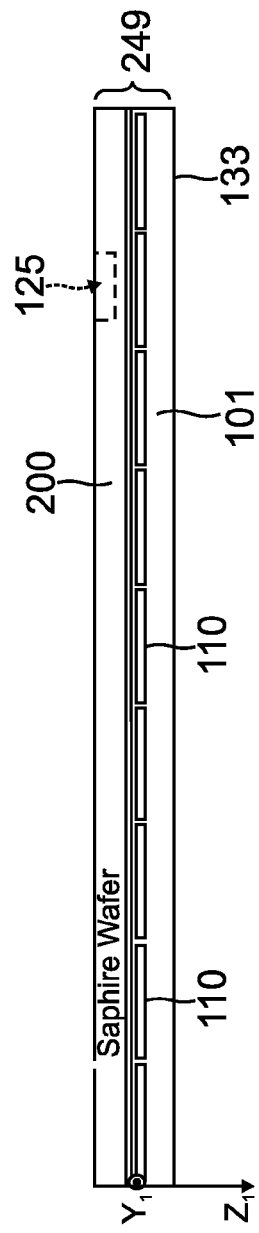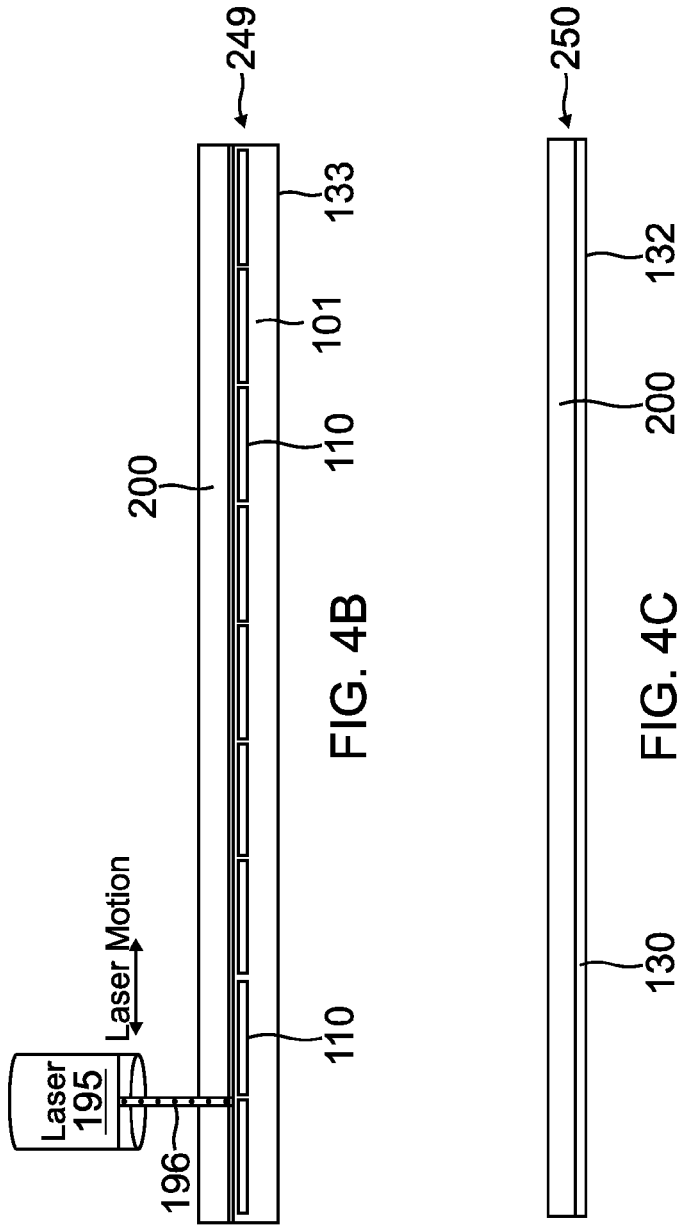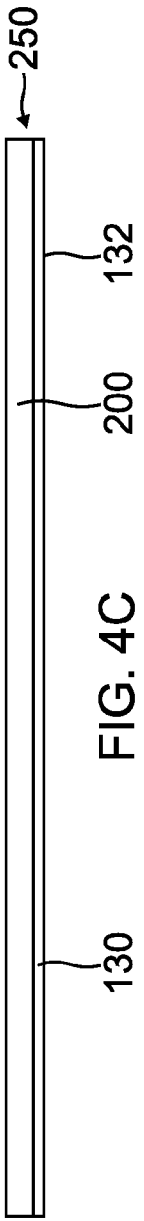

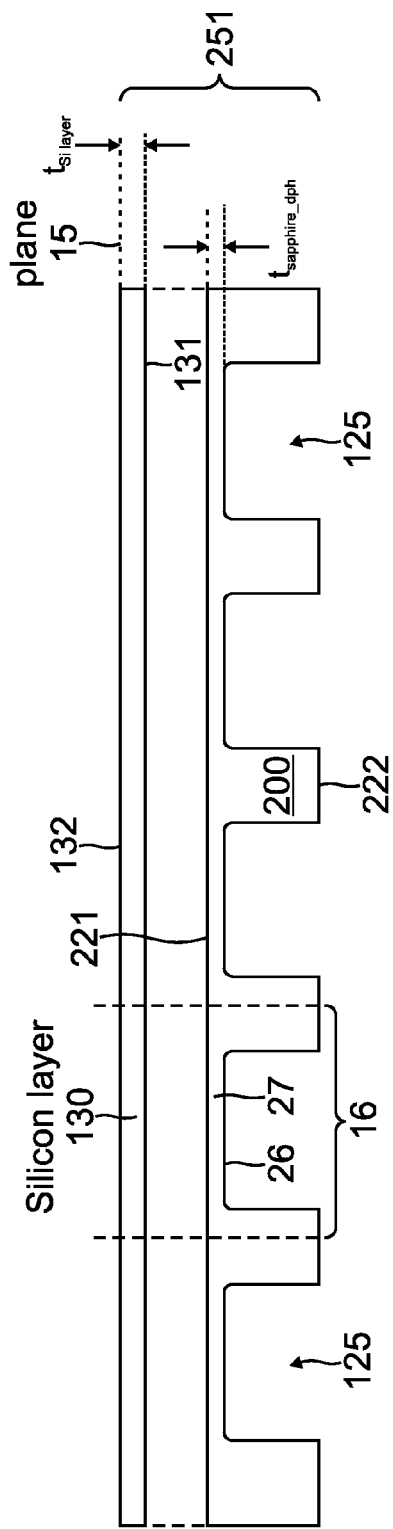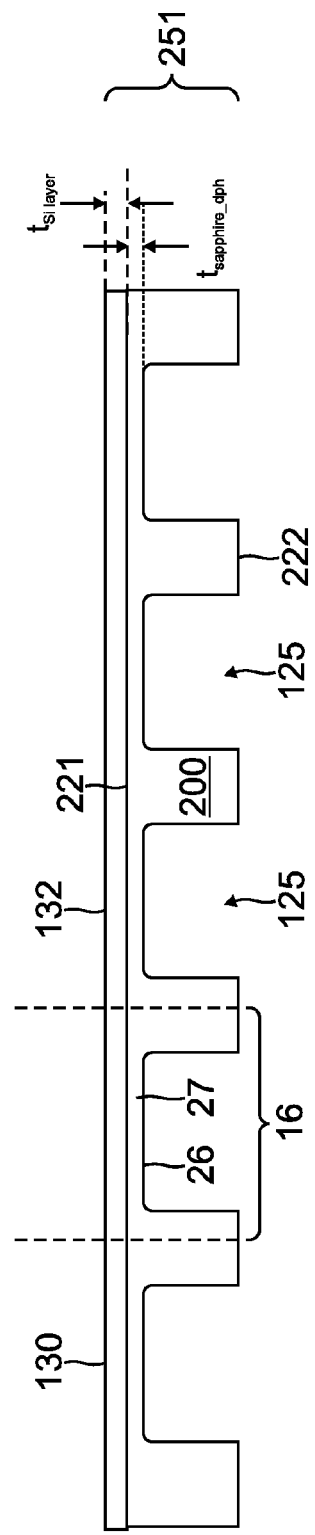
FIG. 7A
FIG. 7B

SILICON-ON-SAPPHIRE DEVICE WITH MINIMAL THERMAL STRAIN PRELOAD AND ENHANCED STABILITY AT HIGH TEMPERATURE

BACKGROUND

Low drift, highly accurate pressure sensors are required for measuring the pressure on drilling tools used to drill deep into the earth. These pressure measurements are referred to as "down-hole pressure measurements". The stability of the pressure sensors for deep well tools in high-temperature, high-pressure, down-hole applications is critical. Deep wells typically have a 20,000 psi background pressure. Pressure differences of 1 or 2 psi (i.e., pressure differences that are 0.01% of the background pressure) between two strata locations can indicate the presence of oil bearing strata. An unstable pressure sensor unit would prevent detection of oil bearing strata in an oil drilling application.

Since drill diameters/pipe diameters of less than 4 inches outer-diameter are required for deep wells, deep well tools require small diameter pressure sensors. Current down-hole, high-temperature, high-pressure devices require a barrier diaphragm between the sensing device and the media being sensed; this barrier diaphragm increases the size of the sensor.

SUMMARY

The present application relates to a silicon-on-sapphire chip with minimal thermal strain preload. The chip includes a sapphire substrate having a first-sapphire surface and an opposing second-sapphire surface; and a silicon layer overlaying the first-sapphire surface. The silicon layer is formed by: creating a plurality of buried cavities in a plane within tens of microns from a first-silicon surface of a silicon wafer; laser fusing at least a portion of the first-silicon surface to at least a portion of the first-sapphire surface at room temperature to attach the silicon wafer to a sapphire wafer, at least a portion of the sapphire wafer including the sapphire substrate; and cleaving the silicon wafer along the plane including the plurality of buried cavities. A silicon-wafer layer attached to the sapphire wafer is formed from the silicon material between the first-silicon surface and the plane of the plurality of buried cavities. The silicon-wafer layer and the sapphire wafer form a silicon-on-sapphire wafer. The silicon-on-sapphire chip is formed by dicing the silicon-on-sapphire wafer.

DRAWINGS

Understanding that the drawings depict only exemplary embodiments and are not therefore to be considered limiting in scope, the exemplary embodiments will be described with additional specificity and detail through the use of the accompanying drawings, in which:

FIGS. 4A-4C show stages of forming a silicon layer overlaying a sapphire wafer in accordance with the present application;

FIG. 7A is an exploded cross-sectional side view of a silicon-on-sapphire wafer with sapphire cavities in the sapphire wafer in accordance with the present application;

FIG. 7B is a cross-sectional side view of a silicon-on-sapphire wafer with sapphire cavities in the sapphire wafer in accordance with the present application;

Figure 1A:
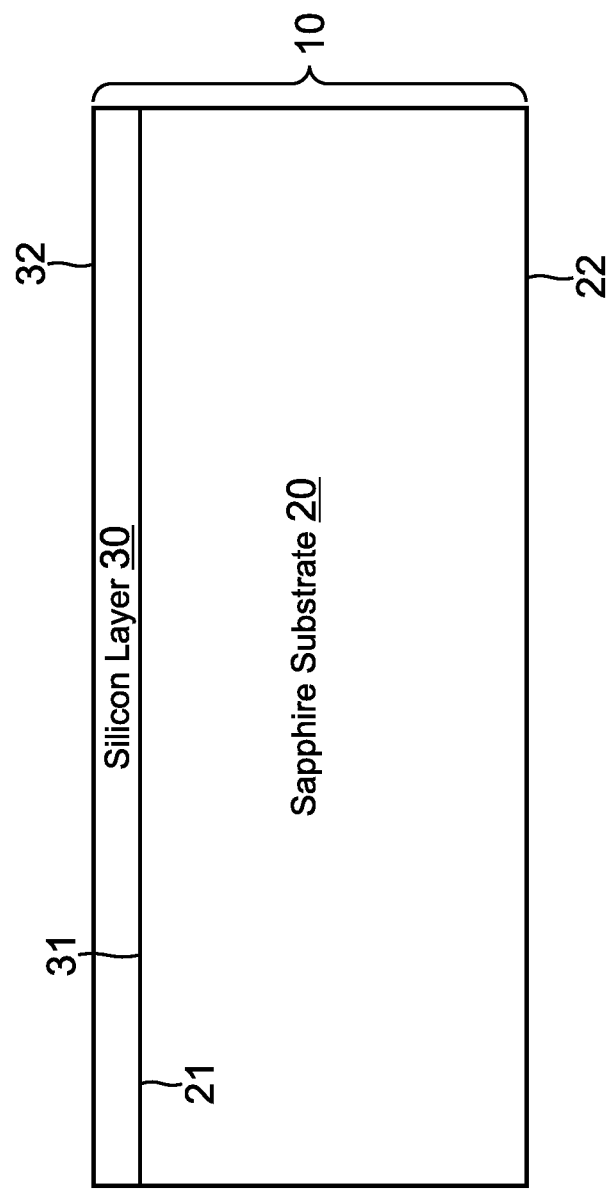
FIG. 1A is silicon-on-sapphire chip in accordance with the present application.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made.

Furthermore, the method presented in the drawing figures and the specification is not to be construed as limiting the order in which the individual steps may be performed. The following detailed description is, therefore, not to be taken in a limiting sense.

High accuracy, high stability pressure sensors that include quartz vibrating elements are currently used in down-hole pressure measurements. These units are inherently fragile and are subject to field failures due to harsh environments associated with deep wells. It is time consuming, and thus expensive, to replace pressure sensors when the quartz vibrating elements are damaged.

Pressure sensors formed using silicon-on-insulator (SOI) technology are suitable up to temperatures of 175° C. The SOI technology uses a glass layer that is formed by a bonding technology or by a Separation by IMplantation of OXygen (SIMOX) technology. The coefficient of thermal expansion (CTE) of glass nearly matches the CTE of silicon.

However, the glass insulation layer of the pressure sensor introduces drift and other non-correctable errors at temperatures above 175° C. These errors are due to the degradation of the mechanical properties of the glass material above 175° C.

Additionally, legacy reverse-bias pressure sensors use a reverse bias diode to isolate the substrate from the pressure bridge piezo-resistors. At high-temperature, the reversed biased junctions become too leaky for reliable pressure sensing. This shortens the life of legacy reverse-bias pressure sensors for down-hole pressure sensing in drilling systems and monitoring system Sapphire is a good electrical insulator. Sapphire-based chips prevent stray currents from spreading between circuits positioned on a chip. Currently available silicon-on-sapphire (SOS) wafers are formed by depositing a decomposition of silane gas ($SiH_4$) on heated sapphire substrates. Since there is a crystal lattice mismatch between the sapphire and silicon, the SOS wafer fabrication process results in the formation of dislocations, twinning, and stacking faults when the SOS wafer is cooled down. Additionally, the CTE mismatch between silicon and the sapphire result in a non-annealable residual stress when cooling the wafer down from bonding temperatures. The residual post-bake stress can be high enough to cause the sapphire to crack during temperature cycling. This makes legacy SOS-based pressure sensors unreliable for down-hole pressure sensing in drilling systems.

The present application overcomes the problems with currently available junction-isolated, SOI, and SOS pressure sensors. The technology disclosed herein forms a silicon-on-sapphire wafer (also referred to herein as a "SOS wafer") that includes a sapphire substrate with a thin layer of doped silicon that is formed, using a low temperature process, on one side of the substrate. The silicon-on-sapphire wafer is diced to form a plurality of a microelectromechanical system (MEMS) silicon-on-sapphire chips and/or devices. The low temperature formation of the silicon on sapphire, described herein, prevents the cracking of the sapphire due to the non-annealable residual stress generated while fabricating the currently available SOS wafers. Since the chips and devices are formed from a silicon-on-sapphire wafer fabricated using only room temperature (or lower) processes, the chips and/or devices have minimal thermal strain; such chips or devices are referred to herein as chips or devices with minimal thermal strain preload. The silicon-on-sapphire chips described herein can be formed with circuitry for pressure sensors, radiation hardened devices, devices for the food and beverage processing industry, biological-sensing devices, and devices for pharmaceutical manufacturing of drugs, minerals, and vitamins. A silicon-on-sapphire chip integrated with at least one circuit is referred also to herein as a silicon-on-sapphire device. The silicon-on-sapphire chips and devices described herein that are: small; impervious to temperature changes; and stable under high pressure conditions found in deep wells.

Embodiments of the SOS wafer described herein are used for MEMS devices that require a thin, strong diaphragm that is contacted by or communicatively coupled to one or more electronic circuit components, including resistive components, trace lines, contact pads, and temperature sensors. The SOS wafer can be used to form a variety of microelectromechanical system (MEMS) silicon-on-sapphire devices, which are also impervious to temperature changes.

The technology described herein is used to fabricate a piezo-resistive pressure bridge on one side of a sapphire die (chip) that has a diaphragm cavity (also referred to herein as a "sapphire cavity") etched on the opposite side to sense pressure. The terms "bridge" and "diaphragm" are used interchangeably herein. When pressure is applied to the diaphragm it deflects creating a strain field that is proportional to the amount of pressure applied. The pressure is applied to either the etched cavity side of the sapphire die or to a media isolation barrier coupled to the sensing diaphragm. Circuitry overlays or is adjacent to the diaphragm in order to generate signals indicative of the amount of strain on the bridge formed by the sapphire cavity. Other circuitry, which may be off of and communicatively coupled to the SOS chip, is configured to input and to process the signals from the diaphragm circuitry and to provide output indicative of the sensed pressure to a user of the pressure sensor (e.g., to an operator of drill on which the pressure sensor is mounted).

The SOS wafers and silicon-on-sapphire chips described herein can be implemented in any of several configurations. In one configuration, a single sapphire die is mounted on a non-conductive substrate (base) made from a suitable material, such as ceramic. There is a close match between coefficient of thermal expansion (CTE) of ceramic and sapphire. Various types of ceramic substrates can be implemented in embodiments described herein including, but not limited to: alumina substrates; high temperature co-fired ceramic (HTCC) substrates; low temperature co-fired ceramic (LTCC) substrates; substrates formed from a plurality of Atomic Layer Deposition (ALD) layers; alumina nitrate substrates; and boron-based substrates. In yet another implementation of this embodiment, a plurality of ALD layers cover the Sapphire and the exposed surfaces of the non-conductive substrate to provide additional media chemical isolation. Alumina is similar to sapphire in corrosion resistance and produces low mechanical hysteresis when it is strained. In some embodiments, the sapphire pressure sensing die is bonded to a non-conductive substrate using a room temperature laser assisted micro welding process. In other embodiments, the die and the non-conductive substrate are cooled to the lower operating temperature before and during the laser micro welding of the sapphire die to the non-conductive substrate. In this case, during normal operation over the operating temperature range, the sapphire pressure sensing diaphragm remains in tension, which provides improved sensing accuracy.

The non-conductive substrate provides interconnection circuits, media isolation (due to its material properties), and stable support that reduces strain effect due to mounting the non-conductive substrate in a sensor housing (e.g., a sealed mounting package). For example, the non-conductive substrate is fabricated to include conductive vias such that the electrical connections to the pressure bridge are available outside of the area exposed to the pressure media. Circuits formed in the non-conductive substrate are also referred to as "substrate circuitry". The interconnections between the pressure piezo-resistive bridge and the non-conductive substrate vias are made using a well known gold bumping process applied to the die interconnect pads. The connection between the die pads and the gold pads on the non-conductive substrate are made by using either a mechanical pressure/vibration technique or by localized heat preferably supplied by a focused laser beam.

The technology described herein utilizes room temperature processes, which are low temperature with reference to the processes to form the legacy silicon-on-sapphire wafer, to create a thin layer of crystalline silicon adjacent to the surface of the silicon wafer. The silicon wafer is bonded to the sapphire wafer using the room temperature laser micro welding technology. After bonding the silicon wafer to the sapphire wafer, the bulk of the silicon wafer is cleaved from the sapphire wafer, leaving a thin layer of silicon. Once in place, this silicon layer is masked and etched using traditional silicon processing technology to create the necessary circuits (e.g., piezo-resistors and interconnects). This device fabrication process advantageously minimizes the residual strains due to CTE mismatch between sapphire and silicon since there is no cool-down from high wafer bonding temperatures.

In one implementation of this embodiment, a silicon-on-sapphire device is mounted with a piezo-resistive bridge facing the non-conductive substrate. This method of mounting the sapphire die uses room temperature laser micro welding technology to fuse the sapphire die to the polished metallization pad on the non-conductive substrate.

The technology described herein eliminates the need for the oil filled metal isolation system used on current downhole high-temperature, high-pressure sensors. Accuracy and drift are minimized due to the very low hysteric nature of the sapphire and non-conductive substrate materials, as well as the low residual strain joining technology represented by laser micro welding. This approach provides miniaturized high-temperature, high-pressure (HTHP) pressure sensors.

FIG. 1A is silicon-on-sapphire chip 10 in accordance with the present application. The silicon-on-sapphire chip 10 includes a sapphire substrate 20 and a silicon layer 30. The sapphire substrate 20 includes a first-sapphire surface 21 and a second-sapphire surface 22 that opposes the first-sapphire surface 21. The silicon layer 30 has a first-silicon surface 31 and a second-silicon surface 32 that opposes the first-silicon surface 31. The silicon layer 30 overlays the first-sapphire surface 21 of the sapphire substrate 20. The first-sapphire surface 21 is joined to the first silicon surface 31.

In one implementation of this embodiment, the sapphire substrate 20 is formed from a portion of a sapphire wafer. In another implementation of this embodiment, the sapphire substrate 20 is formed from a portion of a larger sapphire substrate. The first-silicon surface 31 is attached to the first-sapphire surface 21 in the manner described below with reference to FIGS. 2A-3C. The silicon-on-sapphire chip 10 is formed by dicing a silicon-on-sapphire wafer. A silicon-on-sapphire wafer includes at least a silicon-wafer layer and a sapphire wafer on which the silicon layer has been formed. The silicon-on-sapphire wafer can also include circuits and other layers, such as a non-conductive substrate or base.

Figure 1B:
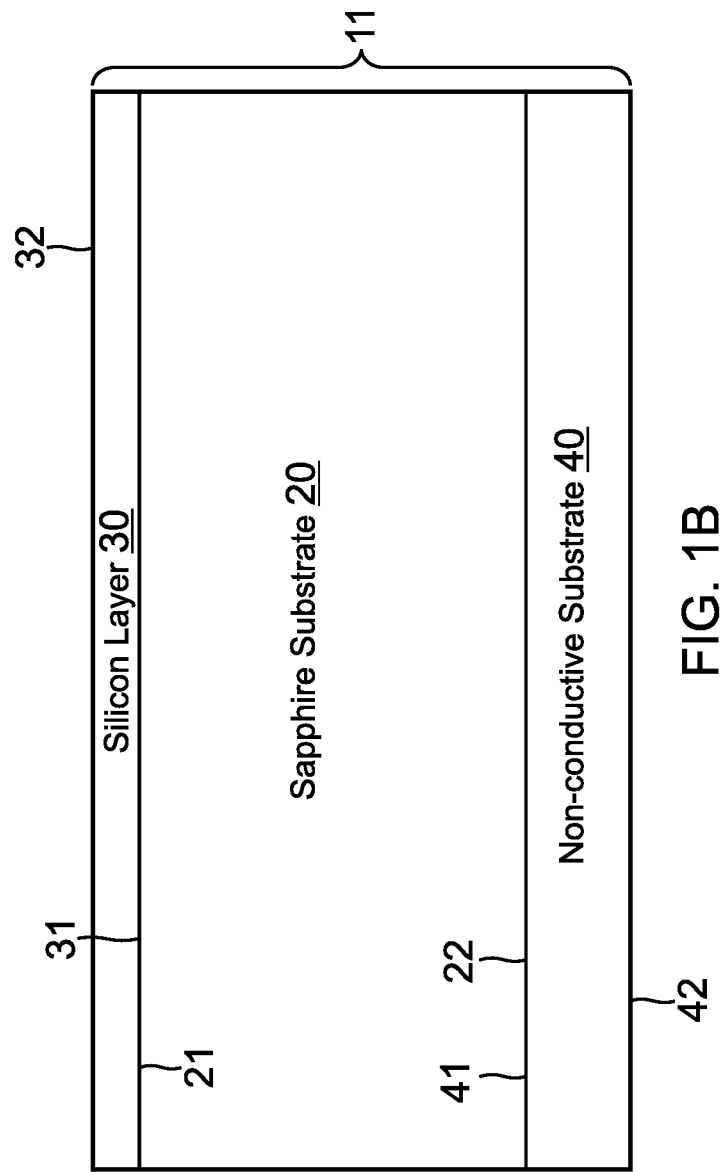
FIG. 1B is silicon-on-sapphire chip with a non-conductive substrate in accordance with the present application.

FIG. 1B is silicon-on-sapphire chip 11 with a non-conductive substrate 40 in accordance with the present application. The non-conductive substrate 40 includes a first surface 41 and an opposing a second surface 42. The silicon-on-sapphire chip 11 differs from the silicon-on-sapphire chip 10 of FIG. 1A in that the first surface 41 of the non-conductive substrate 40 is attached to the second-sapphire surface 22 of the sapphire substrate 20. The first surface 41 is attached to the second-sapphire surface 22 in a low temperature (room temperature) laser micro welding technology as known to one skilled in the art.

The silicon-on-sapphire chip 11 is formed by dicing a silicon-on-sapphire wafer that includes a sapphire wafer on which the silicon layer and the non-conductive substrate have been formed. By using a room temperature laser micro welding technology, fabrication process to conjoin the non-conductive substrate 40 to a silicon-on-sapphire wafer, the temperature of the silicon-on-sapphire wafer is not raised above room temperature during or after the conjoining of the silicon wafer to the sapphire wafer. In one implementation of this embodiment, the silicon-on-sapphire chip 11 is formed by dicing a sapphire wafer on which the silicon layer has been formed and then the resultant die is attached to a non-conductive substrate 40.

Figure 1C:
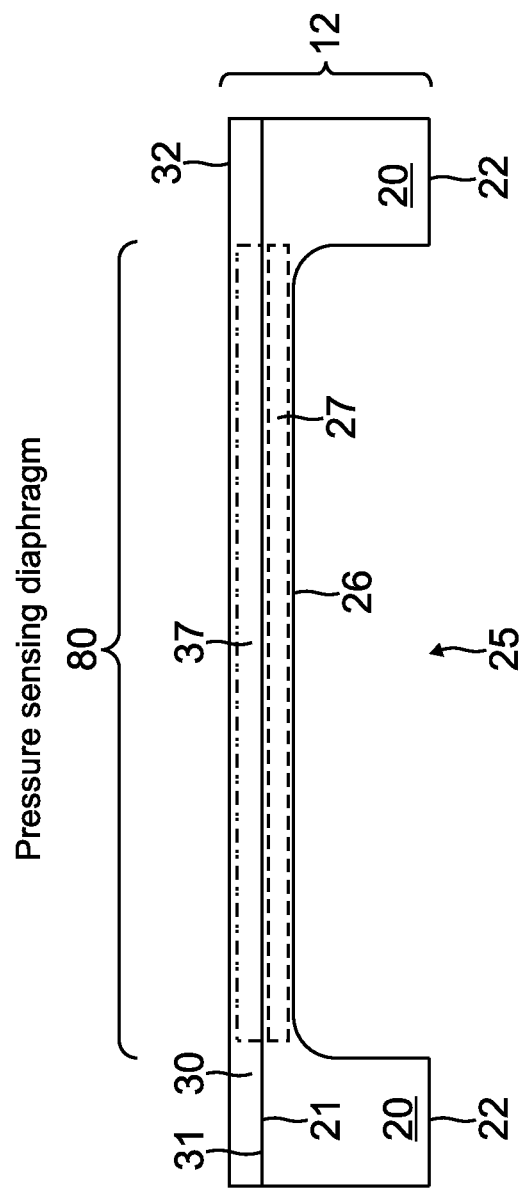
FIG. 1C is silicon-on-sapphire chip with a sapphire cavity in accordance with the present application.

FIG. 1C is silicon-on-sapphire chip 12 with a sapphire cavity 25 in accordance with the present application. The silicon-on-sapphire chip 12 differs from the silicon-on-sapphire chip 10 of FIG. 1A in that a sapphire cavity 25 opens from the second-sapphire surface 22 of the sapphire substrate 20. Typically, the sapphire cavity 25 is formed by etching the second-sapphire surface 22. The sapphire cavity 25 has sapphire-cavity floor 26. A sapphire diaphragm represented generally at dashed region 27 is formed between the sapphire-cavity floor 26 and the first-sapphire surface 21. A silicon diaphragm represented generally at dashed region 37 is formed between the first silicon surface 31 and the second silicon surface 32. The silicon diaphragm 37 is the portion of the silicon layer 30 overlaying the first-sapphire surface 31 and opposing the sapphire-cavity floor 26 of the sapphire cavity 25. Together the sapphire diaphragm 27 and the silicon diaphragm 37 form a pressure sensing diaphragm 80. When the silicon-on-sapphire wafer is diced to form the silicon-on-sapphire chip 12, the dicing is arranged to include at least one sapphire cavity 25 and at least one pressure sensing diaphragm 80 in the chip 12.

If electronic circuits are formed on the silicon-on-sapphire wafer, the dicing is arranged to include the circuits required to for a functional silicon-on-sapphire chip. A silicon-on-sapphire chip that includes circuitry, is also referred to herein as a silicon-on-sapphire device. The circuitry formed on the silicon-on-sapphire wafer described herein includes one or more electronic circuits as required for the functionality of the silicon-on-sapphire devices described herein.

In one implementation of this embodiment, a non-conductive substrate 40 is formed on the second surface 22 of the silicon-on-sapphire chip 12. In another implementation of this embodiment, a non-conductive substrate 40 is formed on the silicon layer 30 of FIGS. 1A-1C.

Figure 2:
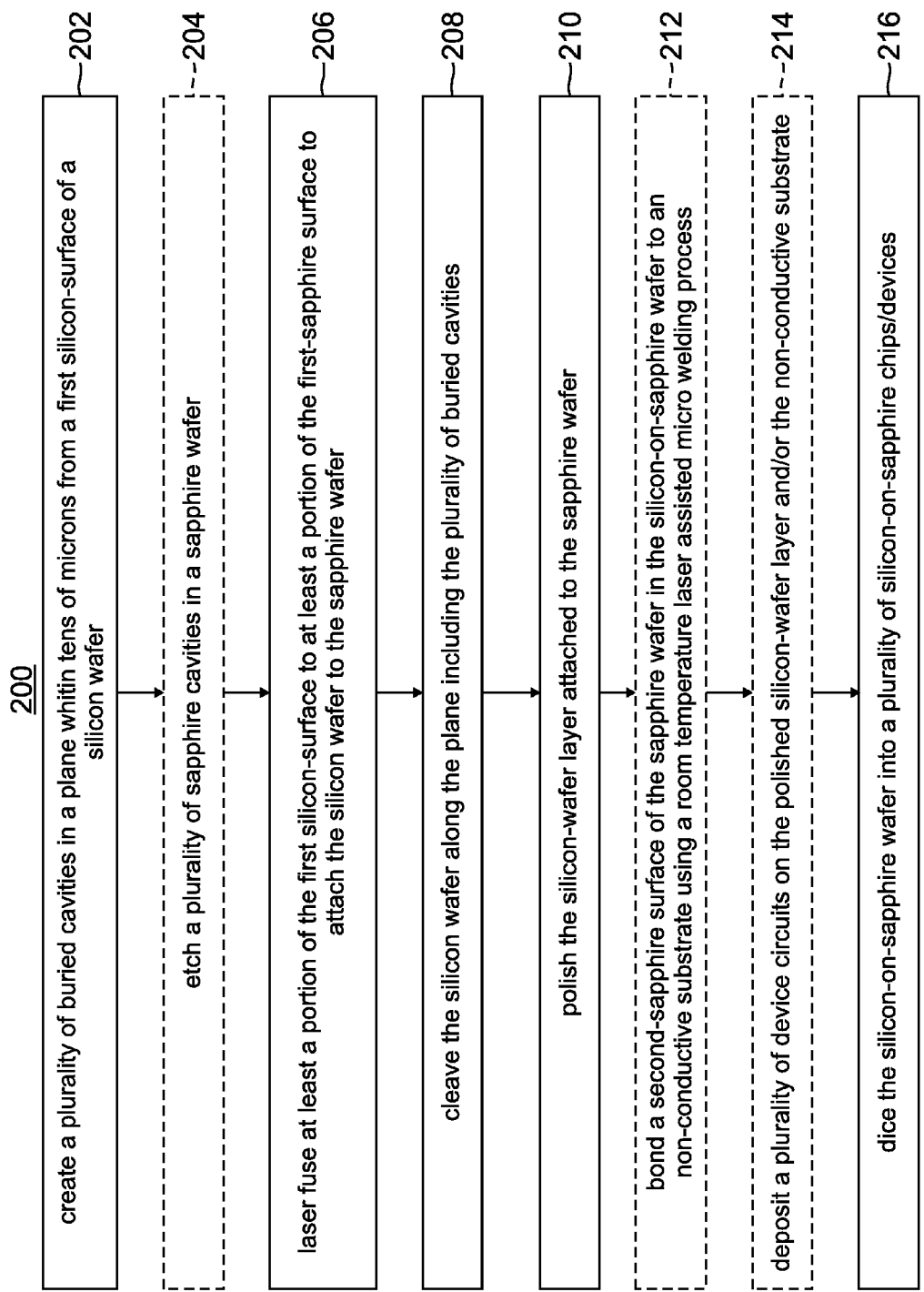
FIG. 2 is a method of forming silicon-on-sapphire devices with minimal thermal strain in accordance with the present application.
Figure 3A:
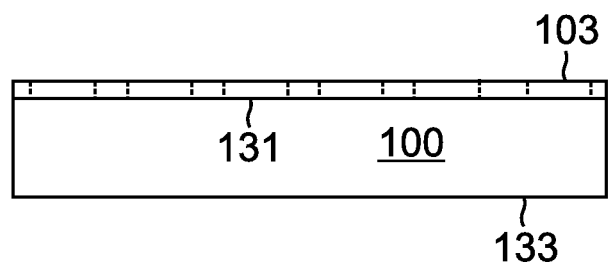
FIGS. 3A-3C show stages of forming buried cavities in a silicon wafer in accordance with the present application.
Figure 3B:
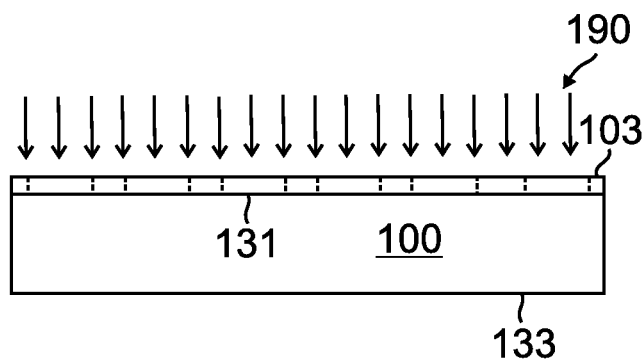
Figure 3C:
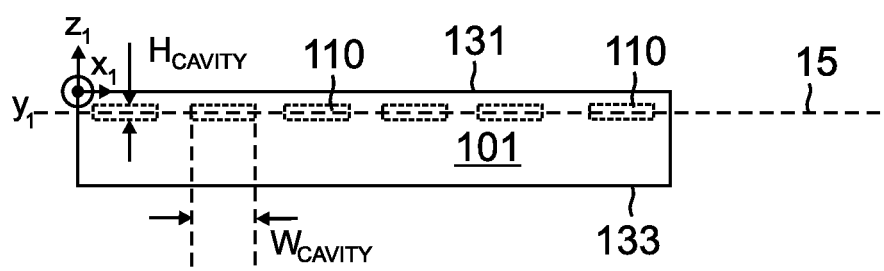

FIG. 2 is a method 200 of forming silicon-on-sapphire devices with minimal thermal strain preload in accordance with the present application. Method 200 is applicable to forming the silicon-on-sapphire chip 10, 11, or 12 described above with reference to FIG. 1A, 1B, or 1C, respectively. The method 200 is described with reference to FIGS. 3A-7B. FIGS. 3A-3C show stages of forming a plurality of buried cavities 110 in the silicon wafer 101 in accordance with the present application. FIGS. 4A-4C (in conjunction with FIGS. 3A-3C) show stages of forming a silicon layer 130 overlaying a sapphire wafer 200 in accordance with the present application. The forming of the silicon layer 130 overlaying a sapphire wafer 200 is done in blocks 202, 206, and 208 of method 200. The processes of method 200 form a silicon layer 130 (FIG. 4C) on a sapphire wafer 200 (FIGS. 4A-4C) using room temperature (or lower) processes.

At block 202, a plurality of buried cavities 110 are formed in a plane, which is shown in cross-sectional view of FIG. 3C as the line 15, within tens of microns from a first-silicon surface 131 of a silicon wafer 101. The plane 15 is an X-Y plane that is parallel to and offset from the $X_1$-$Y_1$ plane shown in FIG. 3C. The plurality of buried cavities 110 in the silicon wafer 101 are used to facilitate the cleaving of the bulk of the silicon wafer 101 from that portion of the silicon wafer 101 that forms a silicon layer on a sapphire wafer.

FIG. 3A shows a patterned mask 103 overlaying the first-silicon surface 131 of a silicon wafer 100. The first-silicon surface 131 opposes a bulk-silicon surface 133 of the silicon wafer 100. FIG. 3B shows hydrogen H represented generally at 190 being implanted through the mask 103 and through the first-silicon surface 131 of the silicon wafer 100. After the H implant is completed, the silicon wafer 100 is heat soaked in a controlled atmosphere. The H implant and heat soak process results in the formation of a plurality of buried cavities 110 shown in FIG. 2C. The heat soak does not cause a CTE issue since this process is completed and the silicon wafer 130 is cooled down prior to any bonding of different materials (e.g., silicon, sapphire, and/or non-conductive substrate). The buried cavities 110 in plane 15 are closely space with minimal vertical (wall) support structures between the buried cavities 110. The density of the webbed vertical support structures is controlled by the implant energy and the duration and the temperature of the heat soak.

FIG. 3C shows the silicon wafer 101 with the plurality of buried cavities that results from the H implant and the heat soak of silicon wafer 100. The width $W_{cavity}$ and height $H_{cavity}$ (FIG. 3C) of the buried cavities 110 is controlled by the masking during the H implant process. The buried cavities 110 are at a depth of about 10,000 Å from the first-silicon surface 131 of the silicon wafer 101. In one implementation of this embodiment, the silicon wafer 101 is a doped silicon wafer 101. In another implementation of this embodiment, the silicon wafer 101 is a $p^{++}$ doped silicon wafer 101. In yet another implementation of this embodiment, the silicon wafer 101 is doped with boron to form a $p^{++}$ doped silicon wafer 101.

Block 204 of method 200 is optional. If method 200 is used to form the silicon-on-sapphire chip 12 shown in FIG. 1C, block 204 is implemented. At block 204, a plurality of sapphire cavities 125 are etched in a sapphire wafer 200. The sapphire cavities 125 are etched to form a plurality of openings in the second-sapphire surface 222. A silicon-on-sapphire wafer 251 includes a silicon layer 130 and a sapphire wafer 200 with a plurality of sapphire cavities 125 is shown in FIGS. 7A and 7B. FIG. 7A is an exploded cross-sectional side view of a silicon-on-sapphire wafer 251 with sapphire cavities 125 in the sapphire wafer 200 in accordance with the present application. FIG. 7B is a cross-sectional side view of a silicon-on-sapphire wafer 251 with sapphire cavities 125 in the sapphire wafer 200 in accordance with the present application. The portion 16 of the silicon-on-sapphire wafer 251 that, upon dicing of the silicon-on-sapphire wafer 251, forms silicon-on-sapphire chip 12 (FIG. 1C) is shown in FIGS. 7A and 7B. The thickness of the sapphire diaphragm 27 in the regions of the pressure sensing diaphragms 80 of the silicon-on-sapphire wafer 251 is $t_{sapphire\_dph}$.

Figure 5:
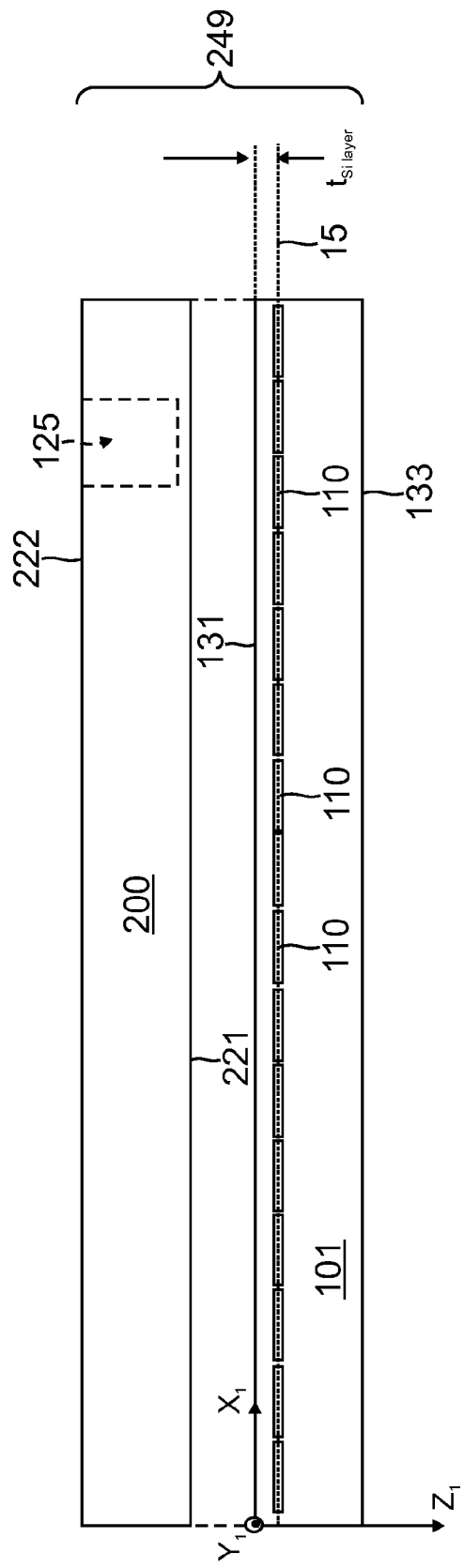
FIG. 5 shows an exploded view of FIG. 4A.

The silicon wafer 101 shown in FIGS. 4A and 4B is flipped about the $X_1$ axis (i.e., is upside down) from the silicon wafer 101 shown in FIG. 3C. As shown in FIG. 4A, the silicon wafer 101 with the plurality of buried cavities 110 is aligned to and in contact with a sapphire wafer 200. The silicon wafer 101 aligned to and in contact with the sapphire wafer 200 is shown as aligned-wafers 249 in FIGS. 4A and 5. An exemplary and optional sapphire cavity 125 is shown the sapphire wafer 200. FIG. 5 shows an exploded view of the aligned-wafers 249 of FIG. 4A in order to more clearly distinguish the surfaces of the silicon wafer 101 and the sapphire wafer 200. The sapphire wafer 200 has a first-sapphire surface 221 and an opposing second-sapphire surface 222. The first-sapphire surface 221 is in the $X_1$-$Y_1$ plane. A normal to the first-sapphire surface 221 is in the $Z_1$ direction. The first-silicon surface 131 of the silicon wafer 101 is in contact with a first-sapphire surface 121 so the first-silicon surface 131 in also in the $X_1$-$Y_1$ plane.

At block 206, at least a portion of the first-silicon surface 131 is laser fused, at room temperature, to at least a portion of the first-sapphire surface 221 to attach the silicon wafer 101 to the sapphire wafer 200. At least the portion of the sapphire wafer 200 that is attached to the silicon wafer 101 includes the sapphire substrate 20 of the silicon-on-sapphire chip 10, 11, and 12 of FIGS. 1A, 1B, and 1C, respectively. FIG. 4B shows a laser 195 moving parallel to the $X_1$-$Y_1$ plane during a room temperature laser fusing process. The laser beam 196 emitted by the laser 195 fuses (bonds) at least a portion of the first-silicon surface 131 to at least a portion of the first-sapphire surface 221 to attach the silicon wafer 101 to the sapphire wafer 200.

At block 208, the silicon wafer 101 is cleaved along the plane 15 that includes the plurality of buried cavities 110. Upon cleaving along the plane 15 that includes the plurality of buried cavities 110, a silicon-wafer layer 130 remains attached to the sapphire wafer 200. The silicon-wafer layer 130 includes the silicon material between the first-silicon surface 131 and the plane 15 of the plurality of buried cavities 110.

Figure 6:
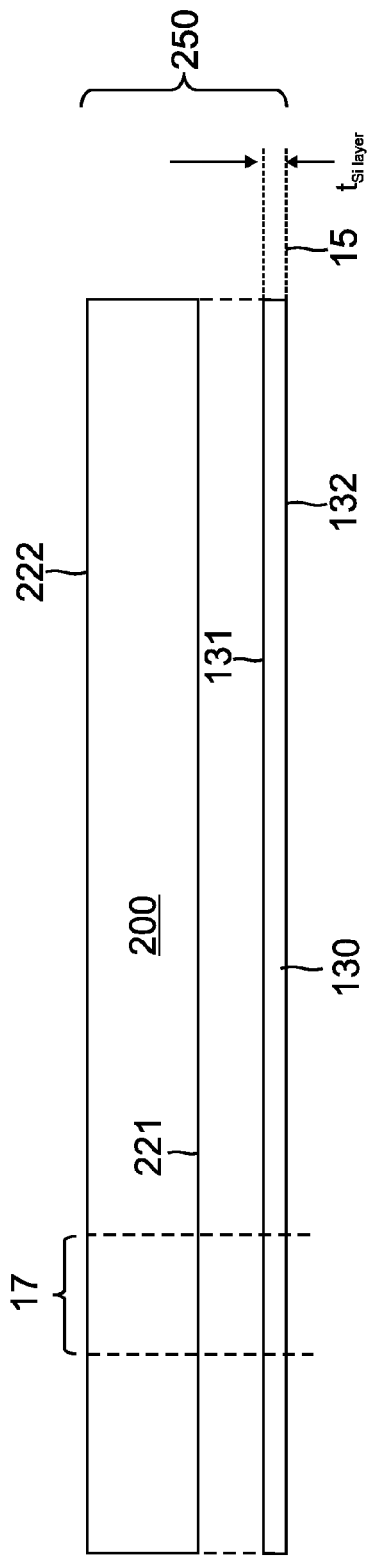
FIG. 6 shows an exploded view of FIG. 4C.

A cleaved surface of the silicon-wafer layer 130 remains when the silicon wafer 101 is cleaved along the plane 15. At block 210, the cleaved surface of the silicon-wafer layer 130 attached to the sapphire wafer 200 is polished to remove any remnants of the vertical (wall) support structures between the buried cavities 110. FIG. 4C shows silicon-on-sapphire wafer 250 with the silicon-wafer layer 130, which has a polished silicon surface 132, after the cleaved surface of the silicon-wafer layer 130 is polished. The polished silicon wafer layer 130 has a thickness $t_{Si\_layer}$. The thickness $t_{Si\_layer}$ is less than tens of microns. In one implementation of this embodiment, the thickness $t_{Si\_layer}$ is on the order to 10,000 Å. FIG. 6 shows an exploded view of the silicon-on-sapphire wafer 250 of FIG. 4C in order to clearly distinguish the surfaces of the silicon-wafer layer 130 and the sapphire wafer 200 in the silicon-on-sapphire wafer 250. The portion 17 of the silicon-on-sapphire wafer 250 that, upon dicing of the silicon-on-sapphire wafer 250, forms silicon-on-sapphire chip 11 (FIG. 1A) is shown in FIG. 6.

Block 212 is optional. If method 200 is used to form the silicon-on-sapphire chip 11 shown in FIG. 1B, the block 212 is implemented. At block 212, the second-sapphire surface 222 of the sapphire wafer 200 in the silicon-on-sapphire wafer 250 or 251 (FIG. 6 or 7B) is bonded to a non-conductive substrate 40 using a room temperature laser assisted micro welding process.

In one implementation of this embodiment, the second-sapphire surface 222 of the sapphire wafer 200 in the silicon-on-sapphire wafer 250 or 251 (FIG. 6 or 7B) is bonded to a non-conductive substrate 40 before the polishing of block 210 occurs. In another implementation of this embodiment, the second-sapphire surface 222 of the sapphire wafer 200 in the silicon-on-sapphire wafer 250 or 251 is bonded to a non-conductive substrate 40 before the cleaving of block 208 occurs. In yet another implementation of this embodiment, the second-sapphire surface 222 is etched with a plurality of sapphire cavities 125 and then at a later time the sapphire wafer 200 with the plurality of sapphire cavities 125 is bonded to a non-conductive substrate 40 having openings that correspond to the sapphire cavities 125. In yet another implementation of this embodiment, the silicon-on-sapphire wafer 250 or 251 is bonded to a non-conductive substrate 40 and then the non-conductive substrate 40 and the sapphire wafer 200 are etched to form a plurality of sapphire cavities 125 in the sapphire wafer 200. Other arrangements of the flow of method 200 are possible.

Figure 9:
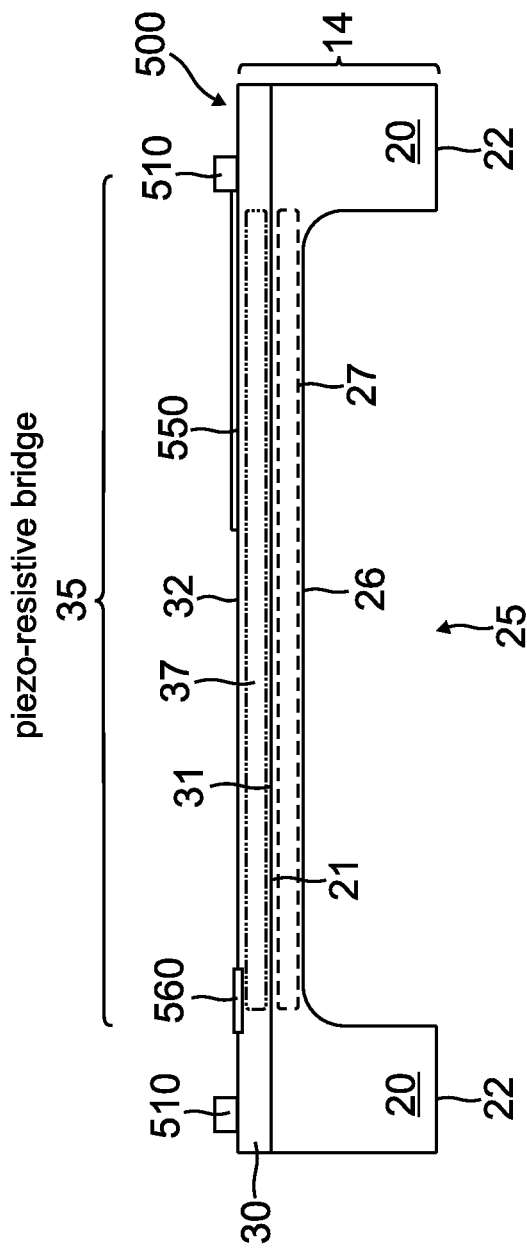
FIG. 9 is silicon-on-sapphire device including circuitry formed in at least the silicon layer with a sapphire cavity in accordance with the present application.
Figure 10:
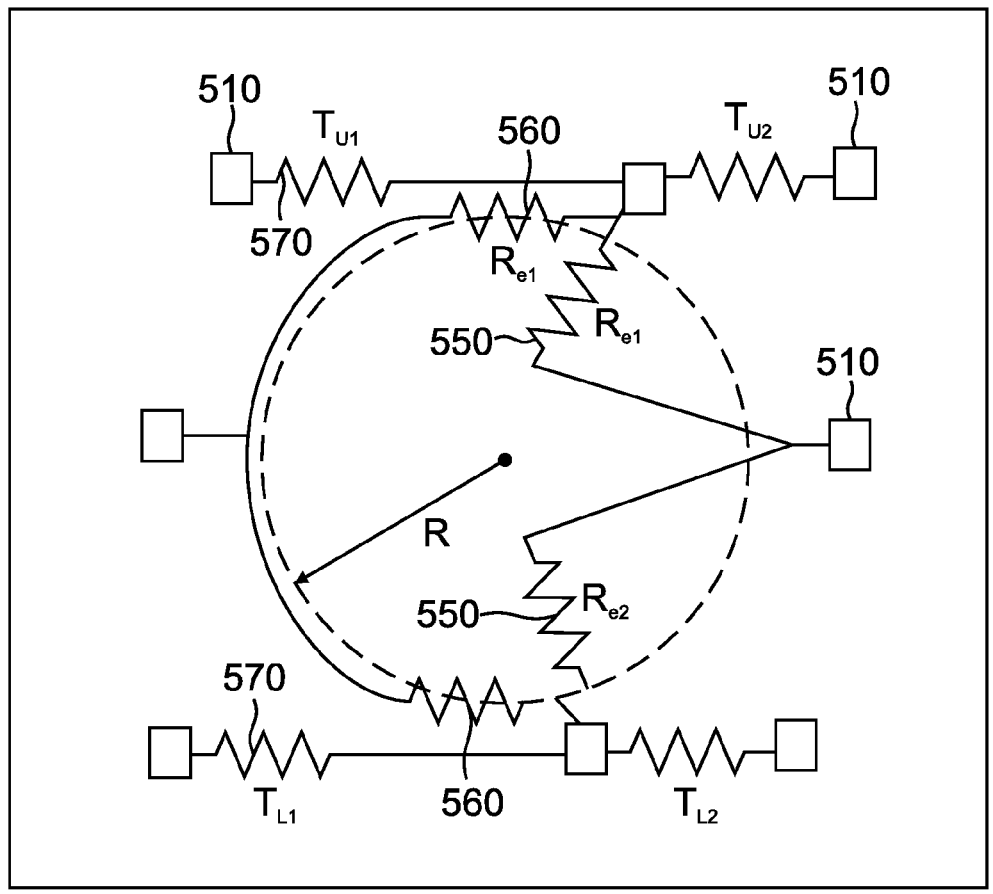
FIG. 10 shows a top view of circuitry formed in the silicon layer of the silicon-on-sapphire device of FIG. 9.

Block 214 is also optional. At block 214, a plurality of device circuits 500 is deposited on the polished silicon-wafer layer 130 so that circuitry 500 is formed in at least the silicon layer 130. A silicon-on-sapphire chip that incorporates circuitry 500 on the silicon-on-sapphire chip (e.g. silicon-on-sapphire chips 10, 11, or 12 as shown in FIGS. 1A-1C, respectively) is also referred to herein as a silicon-on-sapphire device. In another implementation of this embodiment, a plurality of device circuits is deposited on an insulating layer (e.g., non-conductive layer 40) that is also formed on the silicon-on-sapphire wafer 250 or 251. The circuitry 500 is configured in accordance with the function of the silicon-on-sapphire device. The exemplary circuitry shown in FIGS. 8-10 is designed for a pressure sensor that is sufficiently sensitive for deep well drilling.

Figure 8:
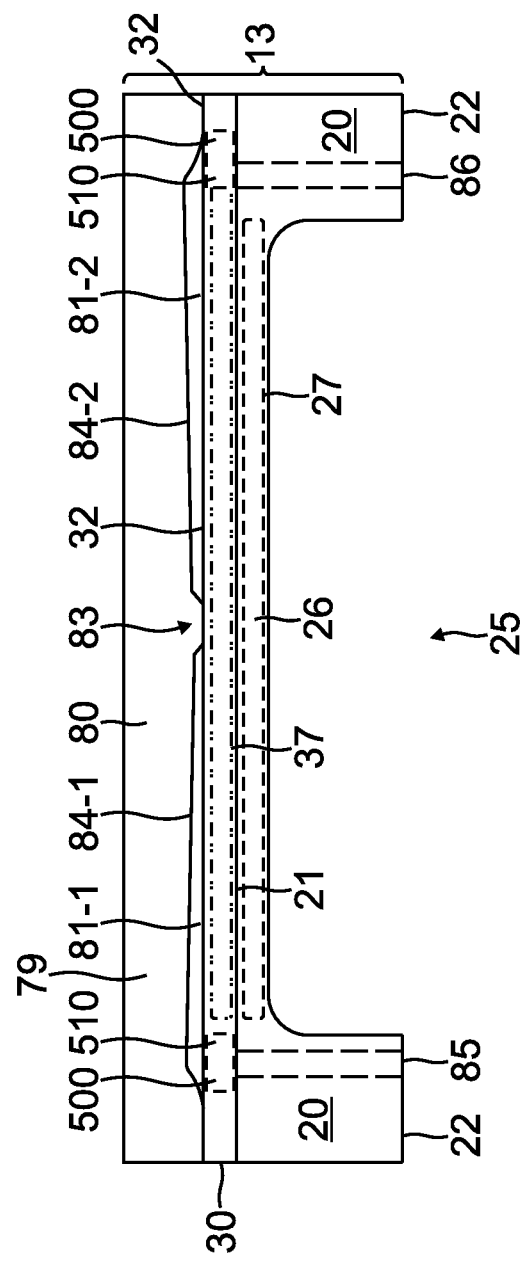
FIG. 8 is a silicon-on-sapphire device including circuitry, a sapphire cavity, and a sapphire cover that forms a pressure sensing diaphragm in accordance with the present application.

FIG. 8 is a silicon-on-sapphire device 13 including circuitry 500, a sapphire cavity 25, and a sapphire cover 79 that forms a pressure sensing diaphragm 80 in accordance with the present application. FIG. 9 is silicon-on-sapphire device 14 including circuitry 500 formed in at least the silicon layer 30 with a sapphire cavity 25 in accordance with the present application. FIG. 10 shows a top view of circuitry 500 formed in the silicon layer of a silicon-on-sapphire device 14 of FIG. 9.

As shown in FIG. 8, a sapphire cover 79 overlays the silicon layer 30. The sapphire cover 79 includes two indents 84-1 and 84-2 that are separated by contact point 83 where the second-silicon surface 32 contacts the sapphire cover 79. The indents 84-1 and 84-2 overlay at least a portion of the silicon diaphragm 37 in the silicon layer 30. In one implementation of this embodiment, the indents 84-1 and 84-2 are evacuated to form two respective reference vacuums 81-1 and 81-2 in contact with the portion of the second-silicon surface 32 that forms the silicon diaphragm 37 in contact with the sapphire diaphragm 27.

The circuitry 500 is formed in at least the silicon layer 30 includes contact pads 510. The circuitry 500 in the sapphire substrate 20 includes at least one through-die metal via 85 and 86 that extend through the sapphire substrate 20 to contact the circuitry 500 (e.g., contact pad 510) formed in the silicon layer 30. If the silicon-on-sapphire device 13 includes a non-conductive substrate, the through-die metal via 85 and 86 that extend through the sapphire substrate 20 electrically connect at least one circuit on the silicon layer 30 to at least one circuit formed in the non-conductive substrate 40.

FIG. 9 is silicon-on-sapphire device 14 including circuitry 500 formed in at least the silicon layer 30 with a sapphire cavity 25 in accordance with the present application. FIG. 10 shows a top view of circuitry 500 formed in the silicon layer 30 of the silicon-on-sapphire device 14 of FIG. 9.

As shown in FIGS. 9 and 10, bridge-tangential-silicon-piezo resistors 560 are formed in the silicon layer 30 with the longitudinal extent of the bridge-tangential-silicon-piezo resistors 560 arranged tangentially to the silicon diaphragm 37 of the pressure sensing diaphragm 80 (FIG. 1C). As shown in FIGS. 9 and 10, bridge-radial-silicon-piezo resistors 550 are formed in the silicon layer 30 with the longitudinal extent of the bridge-radial-silicon-piezo resistors 550 arranged parallel (or approximately parallel) to a radius R (FIG. 10) of the silicon diaphragm 37 of the pressure sensing diaphragm 80 (FIG. 1C). As shown in FIG. 10, the circuitry 500 also includes temperature-sensing resistors 570 to sense a temperature of the silicon layer 30.

The pressure sensing diaphragm 80 (FIG. 1C), at least one bridge-tangential-silicon-piezo resistor 560, and at least one bridge-radial-silicon-piezo resistor 550 in combination form a piezo-resistive bridge 35 that generates a strain field proportional to the amount of pressure applied. When the silicon-on-sapphire chip 13 is used as a pressure sensor, the bridge-tangential-silicon-piezo resistors 560 and the bridge-radial-silicon-piezo resistors 550 are configured to sense the strain field that is proportional to a pressure applied to the piezo-resistive bridge 35.

At block 216, the silicon-on-sapphire wafer is diced into a plurality of silicon-on-sapphire chips or silicon-on-sapphire devices. In one implementation of this embodiment, the silicon-on-sapphire wafer 250 or 251 includes circuitry 500. In this case the silicon-on-sapphire wafer 250 or 251 is diced into a plurality of silicon-on-sapphire devices 13 or 14 that have the appropriate circuits 500 on the silicon-on-sapphire devices 13 or 14 for the functional operation of the silicon-on-sapphire device. In another implementation of this embodiment, the silicon-on-sapphire wafer 251 (FIG. 7B) is diced to form silicon-on-sapphire devices 12 that each include at least one sapphire cavity 25. In another implementation of this embodiment, the silicon-on-sapphire wafer 251 (FIG. 7B) includes circuitry 500 and is diced to form silicon-on-sapphire devices 14 that include at least one sapphire cavity 25 as well as the appropriate circuits 500 for functional operation of the silicon-on-sapphire device 14.

In one implementation of this embodiment, the silicon-on-sapphire device is a radiation hardened device and the circuitry 500 is radiation hardened circuitry 500. In another implementation of this embodiment, the silicon-on-sapphire device is a microwave communication device and the circuitry 500 is configured to pass microwave signals. In yet another implementation of this embodiment, the silicon-on-sapphire device 13, 14 is a biological sensor 13, 14 and the circuitry 500 is configured to sense a presence of at least one biological material on the silicon layer 30. For example, the silicon diaphragm 37 is coated with a material (a biological probe) to which one or more types of biological material (one or more biological targets) are attach based on the biological characteristics of the one or more types of biological material. In yet another implementation of this embodiment, the silicon-on-sapphire device 13, 14 is a high pressure sensor used to sense the pressure during a hot steaming of vessels used by the food and beverage processing industry to clean the vessels. In yet another implementation of this embodiment, the silicon-on-sapphire device 13, 14 is a high pressure sensor used to sense the pressure during a hot steaming of vessels (to clean the vessels) used by the pharmaceutical companies when manufacturing drugs.

One skilled in the art understands the type of silicon-on-sapphire chip (e.g., chip 10, 11, or 12 shown in FIG. 1A, 1B, or 1C) and the form of the circuitry 500 for these different technologies is configured in accordance with the required function.

Figure 11:
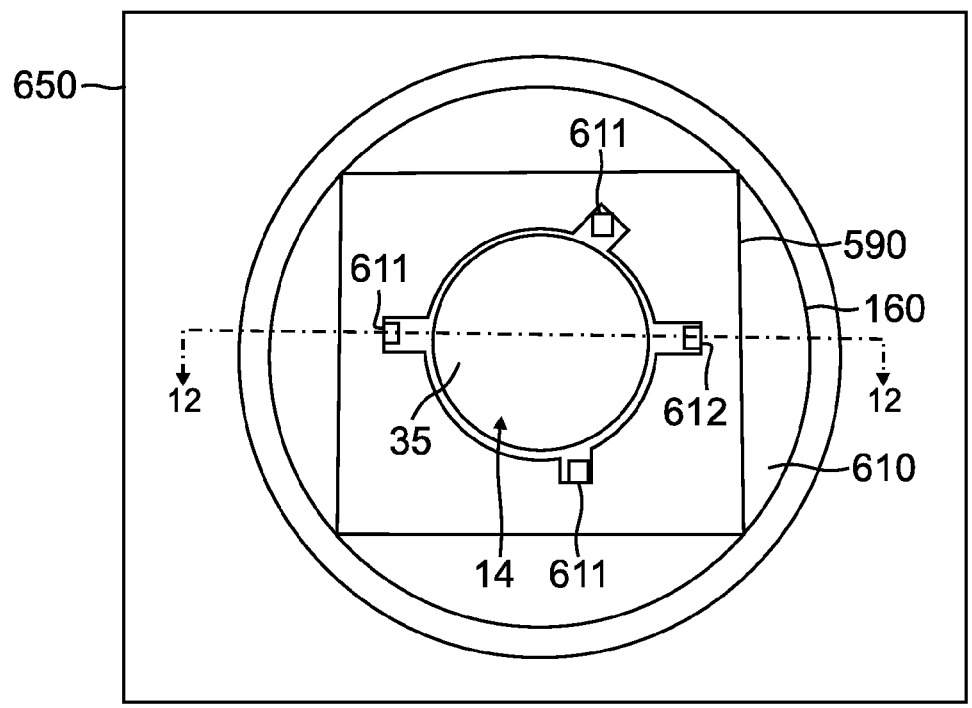
FIG. 11 is a top view of the silicon layer of the silicon-on-sapphire device and circuitry of FIGS. 9 and 10 in an embodiment of a sealed mounting package in accordance with the present application.
Figure 12:
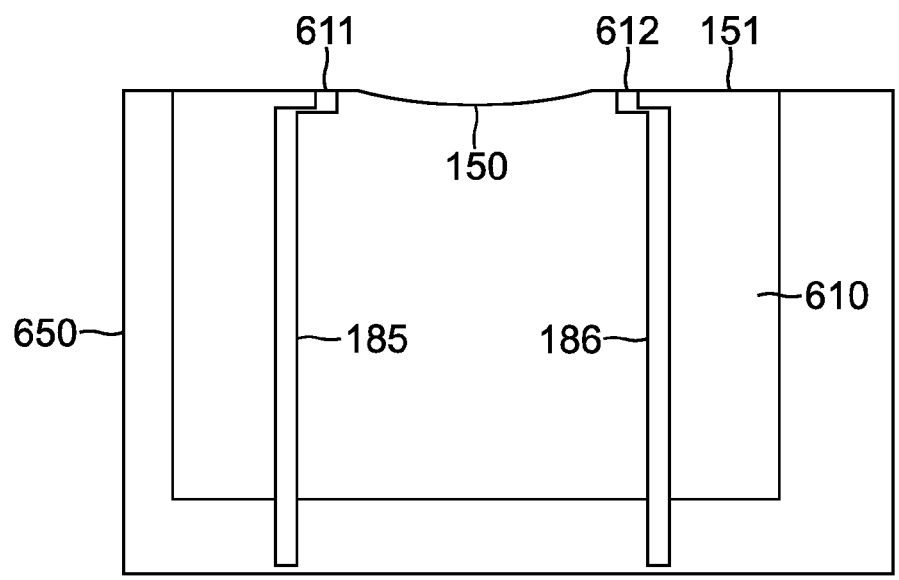
FIG. 12 is a cross-sectional side view of the non-conductive substrate in the sealed mounting package of FIG. 11 without the silicon-on-sapphire device attached to the non-conductive substrate.

FIG. 11 is a top view of the silicon layer of the silicon-on-sapphire device 14 and circuitry 500 of FIGS. 9 and 10 in an embodiment of a sealed mounting package 650 in accordance with the present application. FIG. 12 is a cross-sectional side view of the non-conductive substrate 610 in the sealed mounting package 650 of FIG. 11 without a silicon-on-sapphire device attached to the non-conductive substrate 610. The plane upon which the cross-section view of FIG. 12 is taken is indicated by section line 12-12 in FIG. 11. The non-conductive substrate 610 can be formed from: alumina substrates; high temperature co-fired ceramic (HTCC) substrates; high temperature co-fired ceramic (LTCC) substrates; substrates formed from a plurality of Atomic Layer Deposition (ALD) layers; alumina nitrate substrates; and boron-based substrates. Other materials for the non-conductive substrate 610 are possible.

The sealed mounting package 650 is configured to withstand high-pressure and high-temperature, and is configured to enclose all but the pressure sensing diaphragm of the silicon-on-sapphire device. The non-conductive substrate 610 has a depression 150 (FIG. 12) in the mounting surface 151 to provide clearance for the diaphragm deflection. This depression 150 also provides an over pressure stop, which prevents the pressure sensing diaphragm 80 from cracking or breaking during spikes of high pressure (i.e., overpressure events). In one implementation of this embodiment, the depression 150 is hyperbolic in shape. In another implementation of this embodiment, the depression 150 is spherical in shape.

A stress isolation grove 160 is formed in the non-conductive substrate 610 to encircle the substrate circuitry including contact pads 611 and 612. This improves the sensing accuracy of the pressure sensor by reducing the strain effect due to mounting the non-conductive substrate 610 into the sealed mounting package 650. As shown in FIGS. 11 and 12, substrate circuitry 611, 612, 185 and 186 is formed in the non-conductive substrate 610.

A first via 185 is formed to extend through the non-conductive substrate 610 is in contact with a first contact pad 611 via a trace line in the non-conductive substrate 610. A second via 186 is formed to extend through the non-conductive substrate 610 is in contact with a second contact pad 612 via a trace line in the non-conductive substrate 610. In this manner, at least one via extending from the non-conductive substrate 160 to electrically contacts circuitry 510 associated with at least one of the pressure sensing diaphragm 80 including the sapphire diaphragm 27 and the silicon diaphragm 37.

The minimum size limit of the sealed mounting package 650 and the silicon-on-sapphire device is determined by the die size of the silicon-on-sapphire device plus the wall thickness of the sealed mounting package 650. In one implementation of this embodiment, the die is approximately 0.250" across the corners and the wall thickness of the sealed mounting package 650 is approximately 0.050". In that case, the sensor diameter is 0.350". Thus, it fits into a ⅜" tube in the down-hole tool.

In one implementation of this embodiment, a two layer sapphire die stack is formed (FIG. 8) and piezo resistors and die metallization on the first sapphire die are encapsulated by the second sapphire die which serves as a cap (sapphire cover 79) and a connection to the applied pressure. In another implementation of this embodiment, more than one of the sapphire cavities 25 is in a single silicon-on-sapphire device. In one implementation of this embodiment, Atomic Layer Deposition is used over those surfaces of the sapphire and the non-conductive substrate that are exposed (outside of the sealed mounting package) to provide additional media chemical isolation.

Figure 13A:
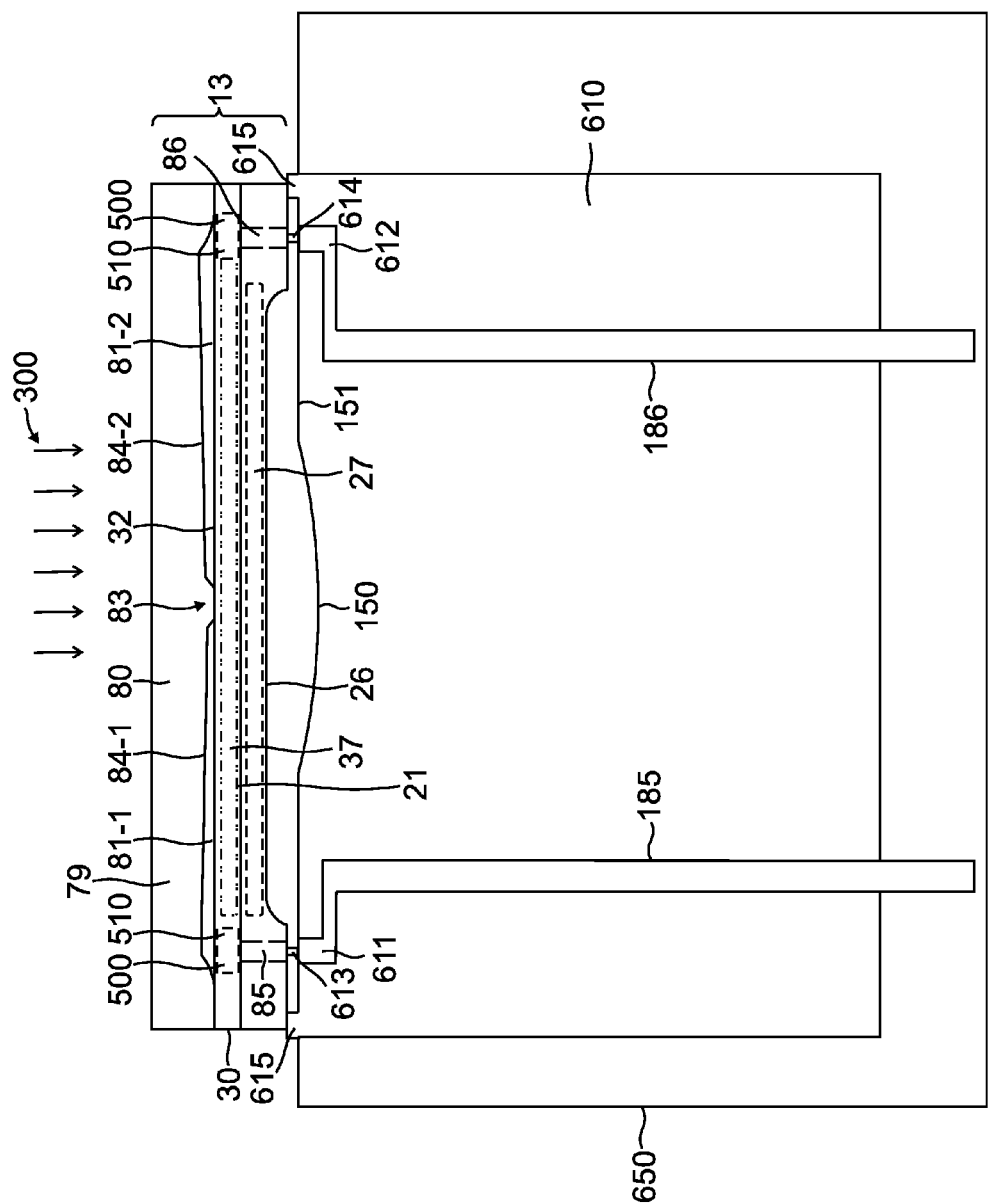
FIG. 13A is a cross-sectional side view of the silicon-on-sapphire device of FIG. 8 attached to the non-conductive substrate of FIG. 12 in accordance with the present application.
Figure 13B:
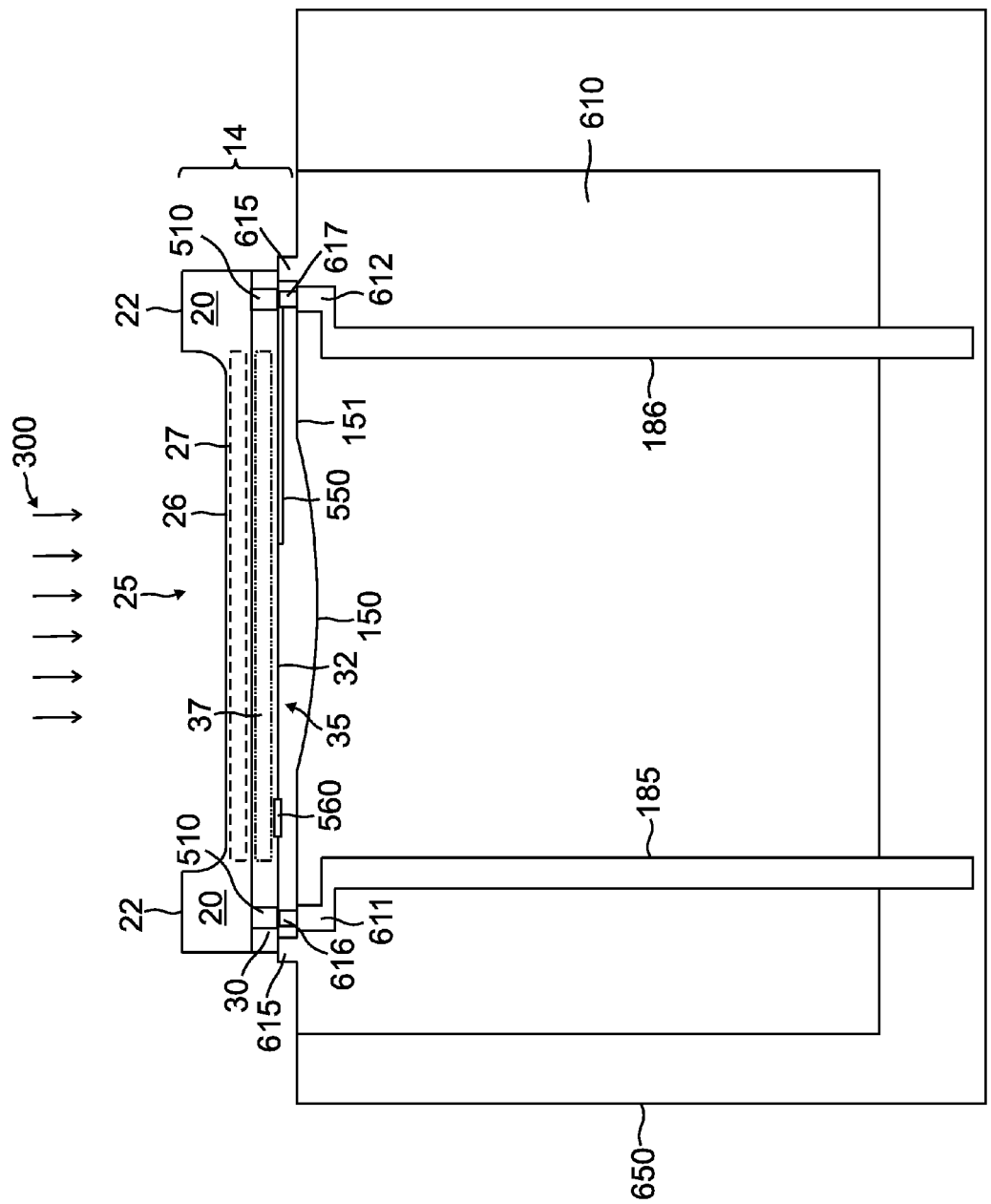
FIG. 13B is a cross-sectional side view of the silicon-on-sapphire device of FIG. 9 attached to the non-conductive substrate of FIG. 12 in accordance with the present application.

FIGS. 13A and 13B show two exemplary embodiments of sealed mounting packages 650 that are configured to withstand high-pressure and high-temperature and that include circuitry configured to sense a pressure applied to the pressure sensing diaphragm of a silicon-on-sapphire device. One skilled in the art, based on reading and understanding this document, understands other configurations of silicon-on-sapphire devices in sealed mounting packages are possible.

FIG. 13A is a cross-sectional side view of the silicon-on-sapphire device 13 of FIG. 8 attached to the non-conductive substrate 610 of FIG. 12 in accordance with the present application. As shown in FIG. 13A, the sapphire cover 79 of the silicon-on-sapphire device 13 is exposed to a pressure represented generally by arrows 300 in the environment of the silicon-on-sapphire device 13. When the sapphire cover 79 experiences pressure 300, the sapphire cover 79 bends in the direction of the sapphire cavity 25 (FIG. 8). The contact point 83 pushes the pressure sensing diaphragm 80 (FIG. 1C), which is formed from the silicon diaphragm 37 and the sapphire diaphragm 27, so the pressure sensing diaphragm 80 is deflected toward the non-conductive substrate 610. The depression 150 in the mounting surface 151 of the non-conductive substrate 610 is shaped to provide clearance for the deflection of the silicon diaphragm 37 and the sapphire diaphragm 27. In the embodiment of silicon-on-sapphire device shown in FIG. 13A, the mounting surface 151 of the non-conductive substrate 610 includes a shoulder portion 615 that encircles a portion of the mounting surface 151 that includes the depression 150. The shoulder 615 isolates the volume between the sapphire-cavity floor 26 and the mounting surface 151 of the non-conductive substrate 610. This volume is evacuated to create a vacuum reference for the silicon-on-sapphire device 13 to measure the absolute pressure. In the manner, the silicon-on-sapphire device 13 is an absolute pressure sensor die with minimal thermal strain preload.

Since the shoulder portion 615 of the non-conductive substrate 610 offsets the silicon-on-sapphire device 13 from the mounting surface 151 of the non-conductive substrate 610, a conductive contact bump 613 is positioned between the via 85 in the sapphire substrate 20 and the contact pad 611 of the non-conductive substrate 610. Similarly, a conductive contact bump 614 is positioned between the via 86 in the sapphire substrate 20 and the contact pad 612 of the non-conductive substrate 610.

Circuitry in the silicon-on-sapphire device 13 is configured to sense the deflection of the silicon diaphragm 37 and the sapphire diaphragm 27. The deflection is proportional to the pressure 300 in the environment. The signals generated by the circuitry 500 (including circuitry 510) are conducted via circuitry 85, 86, 613, 614, 611, 612, 185, and 186 to a processor external to the silicon-on-sapphire device 13. The processed signals provide stable and accurate information indicative of the amount pressure 300 to a user of the silicon-on-sapphire device 13 in a high temperature and high pressure environment. In one implementation of this embodiment, the processor is included in the silicon-on-sapphire device 13.

FIG. 13B is a cross-sectional side view of the silicon-on-sapphire device 14 of FIG. 9 attached to the non-conductive substrate 610 of FIG. 12 in accordance with the present application. As shown in FIG. 13B, the sapphire cavity 21 of the silicon-on-sapphire device 14 is exposed to a pressure 300 in the environment of the silicon-on-sapphire device 14. When the piezo-resistive bridge 35 experiences pressure, the piezo-resistive bridge 35 is deflected toward the non-conductive substrate 610. The depression 150 in the mounting surface 151 of the non-conductive substrate 610 is shaped to provide clearance for the deflection of the piezo-resistive bridge 35. In the embodiment of silicon-on-sapphire device shown in FIG. 13B, the shoulder portion 615 of the non-conductive substrate 610 isolates the volume between the second-silicon surface 32 of the silicon layer 30 and the mounting surface 151 of the non-conductive substrate 610. This volume is evacuated to create a vacuum reference for the silicon-on-sapphire device 14 to measure the absolute pressure. In the manner, the silicon-on-sapphire device 14 is an absolute pressure sensor die with minimal thermal strain preload.

Since the shoulder portion 615 of the non-conductive substrate 610 offsets the silicon-on-sapphire device 14 from the mounting surface 151 of the non-conductive substrate 610, a conductive contact bump 616 is positioned to conduct signals from the contact pad 510 in the sapphire substrate 20 to the contact pad 611 in the non-conductive substrate 610. Similarly, a conductive contact bump 617 is positioned to conduct signals from the contact pad 510 in the sapphire substrate 20 to the contact pad 612 in the non-conductive substrate 610.

The bridge-tangential-silicon-piezo resistors 560 and bridge-radial-silicon-piezo resistors 550 are configured to sense the deflection of the piezo-resistive bridge 35. The signals generated by the circuitry 550 and 560 are conducted via circuitry 510, 616, 617,611, 612, 185, and 186 to a processor external to the silicon-on-sapphire device 14. The processed signals provide stable and accurate information indicative of the amount pressure 300 to a user of the silicon-on-sapphire device 14 in a high temperature and high pressure environment. In one implementation of this embodiment, the processor is included in the silicon-on-sapphire device 14.

Other mounting configurations are possible including extending the sealed mounting package 650 to be adjacent to side walls of the silicon-on-sapphire device.

Example Embodiments

Example 1 includes a silicon-on-sapphire chip with minimal thermal strain preload, the chip comprising: a sapphire substrate having a first-sapphire surface and an opposing second-sapphire surface; and a silicon layer overlaying the first-sapphire surface, the silicon layer formed by: creating a plurality of buried cavities in a plane within tens of microns from a first-silicon surface of a silicon wafer; laser fusing at least a portion of the first-silicon surface to at least a portion of the first-sapphire surface at room temperature to attach the silicon wafer to a sapphire wafer, at least a portion of the sapphire wafer including the sapphire substrate; cleaving the silicon wafer along the plane including the plurality of buried cavities, wherein a silicon-wafer layer attached to the sapphire wafer is formed from the silicon material between the first-silicon surface and the plane of the plurality of buried cavities, wherein the silicon-wafer layer and the sapphire wafer form a silicon-on-sapphire wafer, and wherein the silicon-on-sapphire chip is formed by dicing the silicon-on-sapphire wafer.

Example 2 includes the silicon-on-sapphire chip of Example 1, wherein the sapphire substrate includes a sapphire cavity opening from the second-sapphire surface, the silicon-on-sapphire chip further comprising: a pressure sensing diaphragm including; a sapphire diaphragm formed between a sapphire-cavity floor of the sapphire cavity and the first-sapphire surface; and a silicon diaphragm including a portion of the silicon layer overlaying the first-sapphire surface and opposing the sapphire-cavity floor of the respective at least one sapphire cavity.

Example 3 includes the silicon-on-sapphire chip of any of Examples 1-2, further comprising: at least one non-conductive substrate overlaying at least one of the second-sapphire surface and a second-silicon surface.

Example 4 includes the silicon-on-sapphire chip of Example 3, further including: at least one via extending through at least one of the at least one non-conductive substrate to electrically contact circuitry associated with at least one pressure sensing diaphragm; and substrate circuitry in the at least one of the at least one non-conductive substrate, the substrate circuitry contacting the at least one via extending through the at least one of the at least one non-conductive substrate.

Example 5 includes the silicon-on-sapphire chip of any of Examples 1-4, wherein the silicon layer overlaying the first-sapphire surface is further processed by polishing the silicon-wafer layer attached to the sapphire wafer after the silicon wafer is cleaved.

Example 6 includes the silicon-on-sapphire chip of any of Examples 1-4, wherein the plurality of buried cavities are formed by: implanting hydrogen through the first-silicon surface of the silicon wafer; and heating the silicon wafer.

Example 7 includes a silicon-on-sapphire device with minimal thermal strain preload, the device comprising: a sapphire substrate having a first-sapphire surface and an opposing second-sapphire surface; and a silicon layer having a first-silicon surface and an opposing second-silicon surface, the silicon layer overlaying the first-sapphire surface, the silicon layer formed by: creating a plurality of buried cavities in a plane within tens of microns from a first-silicon surface of a silicon wafer; laser fusing, at room temperature, at least a portion of the first-silicon surface to at least a portion of the first-sapphire surface to attach the silicon wafer to the sapphire wafer, at least a portion of the sapphire wafer including the sapphire substrate; cleaving the silicon wafer along the plane including the plurality of buried cavities, wherein a silicon-wafer layer attached to the sapphire wafer is formed from the silicon material between the first-silicon surface and the plane of the plurality of buried cavities, wherein the silicon-wafer layer and the sapphire wafer form a silicon-on-sapphire wafer; and circuitry formed in at least the silicon-wafer layer, wherein the silicon-on-sapphire device is formed by dicing the silicon-on-sapphire wafer.

Example 8 includes the silicon-on-sapphire device of Example 7, wherein the sapphire substrate includes a sapphire cavity opening from the second-sapphire surface, the silicon-on-sapphire device further comprising: a pressure sensing diaphragm including: a sapphire diaphragm formed between a sapphire-cavity floor of the sapphire cavity and the first-sapphire surface; and a silicon diaphragm including a portion of the silicon layer overlaying the first-sapphire surface and opposing the sapphire-cavity floor of the sapphire cavity, wherein pressure applied to the s pressure sensing diaphragm deflects the pressure sensing diaphragm by an amount proportional to the amount of pressure applied.

Example 9 includes the silicon-on-sapphire device of Example 8, wherein the circuitry formed in at least the silicon layer includes: at least one bridge-tangential-silicon-piezo resistor formed in the silicon layer tangential to the silicon diaphragm; and at least one bridge-radial-silicon-piezo resistor formed in the silicon layer parallel to a radius of the silicon diaphragm, wherein the pressure sensing diaphragm, the at least one bridge-tangential-silicon-piezo resistor, and the at least one bridge-radial-silicon-piezo resistor form a piezo-resistive bridge that generates a strain field proportional to the amount of pressure applied.

Example 10 includes the silicon-on-sapphire device of any of Examples 8-9, further comprising: a sealed mounting package configured to withstand high-pressure and high-temperature, and configured to enclose all but the pressure sensing diaphragm of the silicon-on-sapphire device.

Example 11 includes the silicon-on-sapphire chip of any of Examples 8-10, further comprising: a non-conductive substrate overlaying a second-sapphire surface, the second-sapphire surface opposing the first sapphire surface.

Example 12 includes the silicon-on-sapphire chip of Example 11, further including: at least one via extending from the non-conductive substrate to electrically contact circuitry associated with at least one of the pressure sensing diaphragm; and substrate circuitry in the non-conductive substrate contacting the at least one via.

Example 13 includes the silicon-on-sapphire device of any of Examples 8-12, further comprising: a sealed mounting package configured to withstand high-pressure and high-temperature, wherein the circuitry is configured to sense a pressure applied to the pressure sensing diaphragm.

Example 14 includes the silicon-on-sapphire device of any of Examples 7-13, further comprising: a sapphire cover forming at least one pressure sensing diaphragm overlaying the second-silicon surface of the silicon layer, the sapphire cover encasing at least one reference vacuum in contact with the second-silicon surface.

Example 15 includes a method of forming a silicon-on-sapphire chip with minimal thermal strain preload, the method comprising: creating a plurality of buried cavities in a plane within tens of microns from a first-silicon surface of a silicon wafer; laser fusing, at room temperature, at least a portion of the first-silicon surface to at least a portion of a first-sapphire surface of a sapphire wafer to attach the silicon wafer to the sapphire wafer; cleaving the silicon wafer along the plane including the plurality of buried cavities wherein a silicon-wafer layer attached to the sapphire wafer is formed from the silicon material between the first-silicon surface and the plane of the plurality of buried cavities; polishing the silicon-wafer layer attached to the sapphire wafer, wherein the silicon-wafer layer and the sapphire wafer form a silicon-on-sapphire wafer; and dicing the silicon-on-sapphire wafer into a plurality of silicon-on-sapphire chips.

Example 16 includes the method of Example 15, further comprising: etching a plurality of sapphire cavities in the sapphire wafer.

Example 17 includes the method of Example 16, wherein the dicing comprises: dicing the silicon-on-sapphire wafer so at least a portion of the plurality of silicon-on-sapphire chips include at least one sapphire cavity.

Example 18 includes the method of any of Examples 15-17, further comprising: depositing circuitry on the polished silicon-wafer layer, wherein the dicing comprises; dicing the silicon-on-sapphire wafer so at least one of the plurality of silicon-on-sapphire chips include circuitry.

Example 19 includes the method of any of Examples 15-18, further comprising: bonding a second-sapphire surface opposing the first-sapphire surface of the sapphire wafer to a non-conductive substrate using a room temperature laser assisted micro welding process; forming substrate circuitry in the non-conductive substrate; and forming at least one via in the sapphire wafer to electrically connect the substrate circuitry to circuitry on the polished silicon-wafer layer.

Example 20 includes the method of any of Examples 15-19, further comprising: providing a non-conductive substrate; forming substrate-circuitry, including at least one via, in the non-conductive substrate; forming a depression in a surface of the non-conductive substrate; and attaching circuitry on the polished silicon-wafer layer to the substrate-circuitry.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A silicon-on-sapphire chip with minimal thermal strain preload, the chip comprising:
    a monolithic sapphire substrate having a first-sapphire surface and an opposing second-sapphire surface, wherein the monolithic sapphire substrate includes a sapphire cavity opening from the second-sapphire surface; and
    a silicon layer overlaying the first-sapphire surface, wherein the silicon layer has a thickness less than or equal to 10 microns, and wherein the silicon layer is formed by:
        creating a plurality of buried cavities in a plane less than or equal to 10 microns from a first-silicon surface of a silicon wafer;
        laser fusing at least a portion of the first-silicon surface to at least a portion of the first-sapphire surface at room temperature to attach the silicon wafer to a sapphire wafer, at least a portion of the sapphire wafer including the monolithic sapphire substrate;
        cleaving the silicon wafer along the plane including the plurality of buried cavities,
    wherein a silicon-wafer layer attached to the sapphire wafer is formed from silicon material between the first-silicon surface and the plane of the plurality of buried cavities, wherein the silicon-wafer layer and the sapphire wafer form a silicon-on-sapphire wafer, and wherein the silicon-on-sapphire chip is formed by dicing the silicon-on-sapphire wafer; and
    wherein the silicon-on-sapphire chip further comprises:
    a pressure sensing diaphragm including:
        a sapphire diaphragm formed between a sapphire-cavity floor of the sapphire cavity and the first-sapphire surface; and
        a silicon diaphragm including a portion of the silicon layer overlaying the first-sapphire surface and opposing the sapphire-cavity floor of the respective at least one sapphire cavity.

2. The silicon-on-sapphire chip of claim 1, further comprising:
    at least one non-conductive substrate overlaying at least one of the second-sapphire surface and a second-silicon surface.

3. The silicon-on-sapphire chip of claim 2, further including:
    at least one via extending through at least one of the at least one non-conductive substrate to electrically contact circuitry associated with at least one pressure sensing diaphragm; and
    substrate circuitry in the at least one of the at least one non-conductive substrate, the substrate circuitry contacting the at least one via extending through the at least one of the at least one non-conductive substrate.

4. The silicon-on-sapphire chip of claim 1, wherein the silicon layer overlaying the first-sapphire surface is further processed by polishing the silicon-wafer layer attached to the sapphire wafer after the silicon wafer is cleaved.

5. The silicon-on-sapphire chip of claim 1, wherein the plurality of buried cavities are formed by:

implanting hydrogen through the first-silicon surface of the silicon wafer; and
heating the silicon wafer.

6. A silicon-on-sapphire device with minimal thermal strain preload, the device comprising:
   a monolithic sapphire substrate having a first-sapphire surface and an opposing second-sapphire surface, wherein the monolithic sapphire substrate includes a sapphire cavity opening from the second-sapphire surface; and
   a silicon layer having a first-silicon surface and an opposing second-silicon surface, the silicon layer overlaying the first-sapphire surface, wherein the silicon layer has a thickness less than or equal to 10 microns, and wherein the silicon layer is formed by:
      creating a plurality of buried cavities in a plane less than or equal to 10 microns from a first-silicon surface of a silicon wafer;
      laser fusing, at room temperature, at least a portion of the first-silicon surface to at least a portion of the first-sapphire surface to attach the silicon wafer to the sapphire wafer, at least a portion of the sapphire wafer including the monolithic sapphire substrate;
      cleaving the silicon wafer along the plane including the plurality of buried cavities,
      wherein a silicon-wafer layer attached to the sapphire wafer is formed from the silicon material between the first-silicon surface and the plane of the plurality of buried cavities, wherein the silicon-wafer layer and the sapphire wafer form a silicon-on-sapphire wafer;
   circuitry formed in at least the silicon-wafer layer, wherein the silicon-on-sapphire device is formed by dicing the silicon-on-sapphire wafer; and
   a pressure sensing diaphragm including:
      a sapphire diaphragm formed between a sapphire-cavity floor of the sapphire cavity and the first-sapphire surface; and
      a silicon diaphragm including a portion of the silicon layer overlaying the first-sapphire surface and opposing the sapphire-cavity floor of the sapphire cavity,
   wherein pressure applied to the pressure sensing diaphragm deflects the pressure sensing diaphragm by an amount proportional to the amount of pressure applied.

7. The silicon-on-sapphire device of claim 6, wherein the circuitry formed in at least the silicon layer includes:
   at least one bridge-tangential-silicon-piezo resistor formed in the silicon layer tangential to the silicon diaphragm; and
   at least one bridge-radial-silicon-piezo resistor formed in the silicon layer parallel to a radius of the silicon diaphragm,
   wherein the pressure sensing diaphragm, the at least one bridge-tangential-silicon-piezo resistor, and the at least one bridge-radial-silicon-piezo resistor form a piezo-resistive bridge that generates a strain field proportional to the amount of pressure applied.

8. The silicon-on-sapphire device of claim 6, further comprising:
   a sealed mounting package configured to withstand high-pressure and high-temperature, and configured to enclose all but the pressure sensing diaphragm of the silicon-on-sapphire device.

9. The silicon-on-sapphire chip of claim 6, further comprising:
   a non-conductive substrate overlaying a second-sapphire surface, the second-sapphire surface opposing the first sapphire surface.

10. The silicon-on-sapphire chip of claim 9, further including:
    at least one via extending from the non-conductive substrate to electrically contact circuitry associated with at least one of the pressure sensing diaphragm; and
    substrate circuitry in the non-conductive substrate contacting the at least one via.

11. The silicon-on-sapphire device of claim 6, further comprising:
    a sealed mounting package configured to withstand high-pressure and high-temperature, wherein the circuitry is configured to sense a pressure applied to the pressure sensing diaphragm.

12. The silicon-on-sapphire device of claim 6, further comprising:
    a sapphire cover forming at least one pressure sensing diaphragm overlaying the second-silicon surface of the silicon layer, the sapphire cover encasing at least one reference vacuum in contact with the second-silicon surface.

13. A method of forming a silicon-on-sapphire chip with minimal thermal strain preload, the method comprising:
    providing a monolithic sapphire substrate having a first-sapphire surface and an opposing second-sapphire surface;
    forming a sapphire cavity opening from the second-sapphire surface;
    providing a silicon wafer overlaying the first-sapphire surface;
    creating a plurality of buried cavities in a plane within less than or equal to 10 tens of microns from a first-silicon surface of the silicon wafer;
    laser fusing, at room temperature, at least a portion of the first-silicon surface to at least a portion of the first-sapphire surface of a sapphire wafer to attach the silicon wafer to the sapphire wafer, at least a portion of the sapphire wafer including the monolithic sapphire substrate;
    cleaving the silicon wafer along the plane including the plurality of buried cavities wherein a silicon-wafer layer attached to the sapphire wafer is formed from the silicon material between the first-silicon surface and the plane of the plurality of buried cavities, wherein the silicon-wafer layer has a thickness less than or equal to 10 microns;
    polishing the silicon-wafer layer attached to the sapphire wafer, wherein the silicon-wafer layer and the sapphire wafer form a silicon-on-sapphire wafer; and
    dicing the silicon-on-sapphire wafer into a plurality of silicon-on-sapphire chips;
    forming a pressure sensing diaphragm, including:
       forming a sapphire diaphragm between a sapphire-cavity floor of the sapphire cavity and the first sapphire surface; and
       forming a silicon diaphragm including a portion of the silicon layer overlaying the first-sapphire surface and opposing the sapphire-cavity floor of the respective at least one sapphire cavity.

14. The method of claim 13, further comprising:
    etching a plurality of sapphire cavities in the sapphire wafer.

15. The method of claim 14, wherein the dicing comprises:

dicing the silicon-on-sapphire wafer so at least a portion of the plurality of silicon-on-sapphire chips include at least one sapphire cavity.

16. The method of claim 13, further comprising:

depositing circuitry on the polished silicon-wafer layer, wherein the dicing comprises;

dicing the silicon-on-sapphire wafer so at least one of the plurality of silicon-on-sapphire chips include circuitry.

17. The method of claim 13, further comprising:

bonding a second-sapphire surface opposing the first-sapphire surface of the sapphire wafer to a non-conductive substrate using a room temperature laser assisted micro welding process;

forming substrate circuitry in the non-conductive substrate; and forming at least one via in the sapphire wafer to electrically connect the substrate circuitry to circuitry on the polished silicon-wafer layer.

18. The method of claim 13, further comprising:

providing a non-conductive substrate;

forming substrate-circuitry, including at least one via, in the non-conductive substrate;

forming a depression in a surface of the non-conductive substrate; and attaching circuitry on the polished silicon-wafer layer to the substrate-circuitry.

* * * * *

UNITED STATES PATENT AND TRADEMARK OFFICE
CERTIFICATE OF CORRECTION

PATENT NO. : 9,890,033 B2  
APPLICATION NO. : 14/679420  
DATED : February 13, 2018  
INVENTOR(S) : Gregory C. Brown Page 1 of 1

It is certified that error appears in the above-identified patent and that said Letters Patent is hereby corrected as shown below:

In the Claims

In Column 18, Claim 13, Line 34, please remove "within" between "plane" and "less".

In Column 18, Claim 13, Line 35, please remove "tens of" between "10" and "microns".

Signed and Sealed this  
Eighth Day of October, 2019

Andrei Iancu  
*Director of the United States Patent and Trademark Office*